United States Patent [19]
Kudo

[11] Patent Number: 5,808,814
[45] Date of Patent: Sep. 15, 1998

[54] SHORT WAVELENGTH PROJECTION OPTICAL SYSTEM

[75] Inventor: Shintaro Kudo, Kanagawa, Japan

[73] Assignee: Nikon Corporation, Japan

[21] Appl. No.: 683,288

[22] Filed: Jul. 18, 1996

[51] Int. Cl.⁶ .............................. G02B 9/00; G02B 9/60
[52] U.S. Cl. ............................ 359/754; 359/763
[58] Field of Search .................. 359/754, 740, 359/739, 747, 752, 757, 766, 771, 776, 738

[56] References Cited

U.S. PATENT DOCUMENTS

| | | | |
|---|---|---|---|
| 3,909,115 | 9/1975 | Kano | 350/214 |
| 4,089,591 | 5/1978 | Glatzel et al. | 350/214 |
| 4,666,273 | 5/1987 | Shimizu et al. | 353/101 |
| 4,770,477 | 9/1988 | Shafer | 350/1.2 |
| 4,772,107 | 9/1988 | Friedman | 350/463 |
| 4,811,055 | 3/1989 | Hirose | 355/53 |
| 4,891,663 | 1/1990 | Hirose | 355/53 |
| 4,977,426 | 12/1990 | Hirose | 355/53 |
| 5,105,075 | 4/1992 | Ohta et al. | 250/201.2 |
| 5,170,207 | 12/1992 | Tezuka et al. | 355/53 |
| 5,221,995 | 6/1993 | Yaneyama | 359/688 |
| 5,260,832 | 11/1993 | Togino et al. | 359/679 |
| 5,526,186 | 6/1996 | Sekine | 359/683 |

FOREIGN PATENT DOCUMENTS

| | | | |
|---|---|---|---|
| 0712019 A2 | 5/1996 | European Pat. Off. | G02B 13/24 |
| 5-173065 | of 1993 | Japan | G02B 13/14 |
| 7-140384 | 11/1993 | Japan . | |
| 7-140385 | 11/1993 | Japan . | |

*Primary Examiner*—Frank G. Font
*Assistant Examiner*—Michael P. Stafira
*Attorney, Agent, or Firm*—Skjerven, Morrill, MacPherson, Franklin & Friel LLP; Norman R. Klivans; Michael J. Halbert

[57] ABSTRACT

A short wavelength reduction projection optical system used for transferring integrated circuit patterns from a reticle to a wafer in a semiconductor manufacturing system. The optical system has object side and image side virtually telecentric, high resolution over a wide exposure area, and adequately compensates for optical aberrations without increasing the length of the optical system. The optical system has a first group of lenses with weak refractive power, a second group of lenses with a positive refractive power, a third group of lenses with a negative refractive power, a fourth group of lenses with a positive refractive power, and an aperture stop located between the third and fourth groups of lenses.

23 Claims, 16 Drawing Sheets

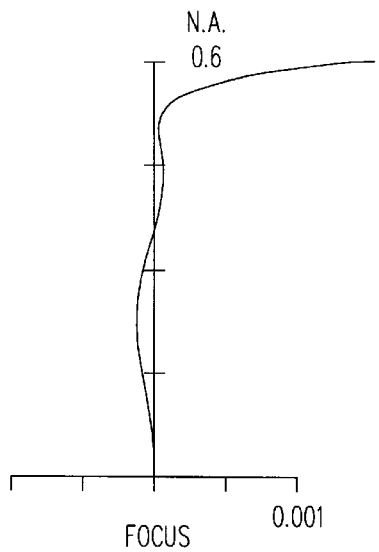
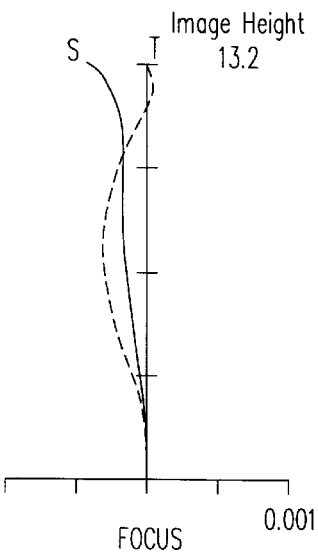
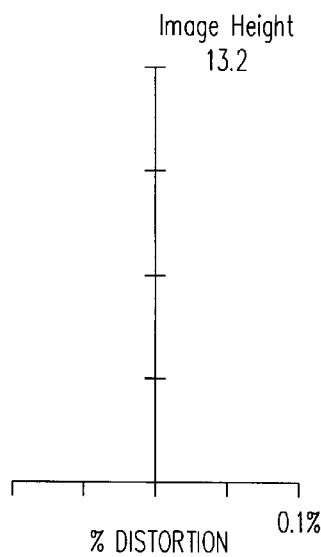
FIG. 2B    FIG. 2C    FIG. 2D
FIG. 2E

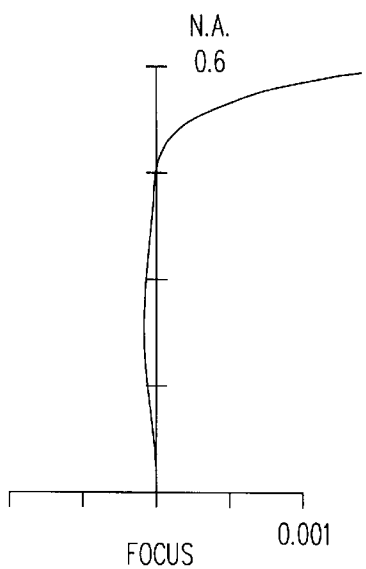
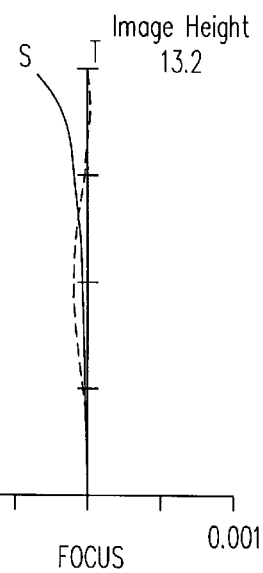
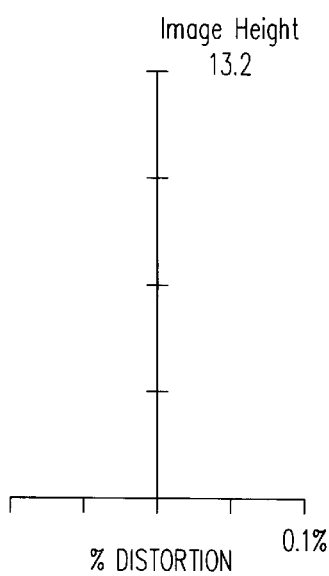
FIG. 4B
FIG. 4C
FIG. 4D
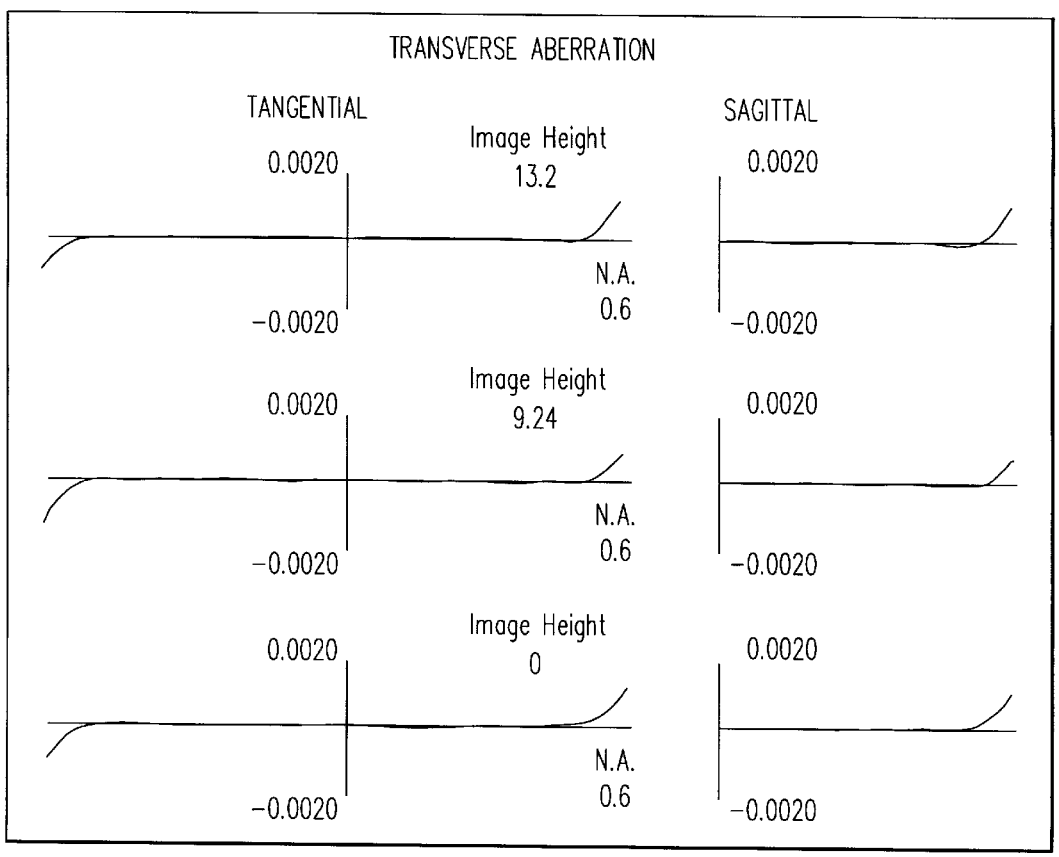
FIG. 4E

SHORT WAVELENGTH PROJECTION OPTICAL SYSTEM

BACKGROUND OF THE INVENTION

1. Field of the Invention

This invention relates generally to optical systems and, more particularly, to projection optical systems used in semiconductor manufacture and, even more particularly, to short wavelength reduction projection optical systems used for transferring integrated circuit patterns from a reticle to a wafer.

2. Discussion of Related Art

In semiconductor device manufacturing, projection optical systems are used to transfer integrated circuit (IC) patterns such as large scale integrated (LSI) circuit patterns from a reticle, also known as a mask, onto a wafer or semiconductor substrate upon which the semiconductor device is being formed. Because of the difference in the relative sizes of the reticle and the resulting semiconductor device, also known as a die or a semiconductor chip, the projection optical system must be a reduction projection optical system. Modern integrated circuits are becoming more integrated; that is, more and more functions are being integrated into circuits to be placed onto a single die. At the same time, however, there is a major effort not to allow the die to grow in size in order to maintain or improve the performance and speed of the semiconductor device being manufactured. Therefore, to maintain the same or reduced die size, the reduction projection optical system must have a wider exposure area and a higher resolution.

One method to increase the resolution of the optical system is to illuminate the reticle with shorter wavelength illumination. In principle, the shorter the wavelength, the higher the resolution. In the search for shorter wavelength illumination sources, there have been identified two excimer lasers that can be used: the KrF excimer laser with a 248 nanometer wavelength and the ArF with a 193 nanometer wavelength. These excimer lasers are to replace the mercury-arc lamp as an illumination source for semiconductor manufacturing. The mercury-arc lamp supplies the g-line that has a wavelength of 436 nanometers and the i-line that has a wavelength of 365 nanometers from the ultraviolet spectrum of the mercury-arc lamp. These two ultraviolet lines are presently the principle illumination sources used in semiconductor wafer manufacturing.

The major problem with utilizing the shorter wavelengths provided by the excimer lasers is the limited availability of optical materials suitable for use in the wavelength range of the excimer lasers. The principal reason the optical materials are unsuitable is that the transmission factor of most optical materials is too limited to be used at these short wavelengths. Currently, the following two optical materials are considered feasible for use in short wavelength systems: fused silica ($SiO_2$) and fluorite ($CaF_2$). These optical materials, however, have low refractive indices compared to other optical materials. The use of optical materials with low refractive indices makes compensation of optical aberrations more difficult when designing an optical system with the required high resolution.

Many of these projection optical systems are nearly image-side telecentric which means the exit pupil is located virtually at infinity. The advantage of using an optical system with image-side telecentricity or near image-side telecentricity is that variations in projection magnification are negligible or can be easily compensated. These variations are caused by errors in the optical axis direction such as focus errors during exposure and variations in the flatness of the image surface, which in this case, is the wafer. Up to now, variations in the flatness of the mask could be ignored; however, because circuit patterns are becoming smaller, variations in the mask can no longer be ignored.

What is needed is a reduction projection optical system in which both the object side and image side are telecentric, which has high resolution over a wide exposure area, and which adequately compensates for optical aberrations while maintaining the present overall length of the optical system. The overall length of the projection optical system cannot be increased because the size is constrained by the plant (a stage in a semiconductor manufacturing system) and the overall system size.

SUMMARY

The present invention is directed to a projection optical system with, in order from the object side, a first group of lenses, a second group of lenses with a positive refractive power, a third group of lenses with a negative refractive power, and a fourth group of lenses with a positive refractive power. An aperture stop is disposed between the third group of lenses and the fourth group of lenses. The overall optical system satisfies the following conditions:

$$|En|>L \text{ and } |Ex|>|L/\beta|,$$

where En is the distance measured from the first optical surface on the object side of the optical system to the entrance pupil of the optical system; L is the distance between an object and an image of the optical system; Ex is the distance measured from the last optical surface on the image side of the optical system to the exit pupil of the optical system; and $\beta$ is the overall magnification of the optical system.

The overall optical system also satisfies the following conditions:

$$-2.3\beta 1/\beta < -1.6 \text{ and } |f1|>L,$$

where $\beta 1$ and f1 are the magnification and the focal length of the first group of lenses, respectively.

The overall optical system also satisfies the following conditions:

$$2<\beta 4/\beta<3 \text{ and } \delta 34/L>0.05,$$

where $\beta 4$ is the magnification of the fourth group of lenses and $\delta 34$ is the axial distance from the last surface of the third group of lenses to the first surface of the fourth group of lenses.

The fourth group of lenses in the optical system satisfies the following condition:

$$0.09<f4/L<0.16,$$

where f4 is the focal length of the fourth group of lenses.

The second group of lenses in the optical system satisfies the following condition:

$$0.1<f2/L<0.2,$$

where f2 is the focal length of the second group of lenses.

The third group of lenses in the optical system satisfies the following condition:

$$-0.12 < f3/L < -0.06,$$

where f3 is the focal length of the third group of lenses.

The third group of lenses in the optical system includes a pair of concave optical surfaces facing each other, and one embodiment of the invention has a negative refractive power lens disposed between the pair of concave optical surfaces. The negative refractive power lens satisfies the following condition:

$$q32 < -0.2,$$

where the shape factor q32 is defined by the following equation:

$$q32=(C1+C2)/(C1-C2),$$

where C1 is the curvature of the object side optical surface and C2 is the curvature of the image side optical surface of the negative refractive power lens.

The first group of lenses in the optical system has a front group of lenses with a positive refractive power and a rear group of lenses with a negative refractive power. In the first embodiment of the present invention, the front group of lenses has two positive refractive power lenses and the rear group of lenses has two negative refractive power lenses. In the second embodiment of the present invention, the rear group has three negative refractive power lenses and the front group has two positive refractive power lenses. In the third embodiment of the present invention, the fourth group of lenses has an additional negative refractive power lens. In the fourth embodiment of the present invention, the front group of lenses of the first group of lenses has three positive refractive power lenses and the rear group has three negative refractive power lenses. In the fifth embodiment of the present invention, the front group of lenses of the first group of lenses has three positive refractive power lenses and the rear group of lenses of the first group of lenses has four negative refractive power lenses. In the sixth embodiment of the present invention, the second group of lenses has five positive refractive power lenses. In the seventh embodiment of the present invention, the front group of lenses of the first group of lenses has four positive refractive power lenses and the rear group of lenses of the first group of lenses has four negative refractive power lenses and the fourth group of lenses has an additional negative refractive power lens.

BRIEF DESCRIPTION OF THE DRAWINGS

The accompanying drawings, incorporated in and forming a part of the specification, illustrate the present invention and, together with the description, serve to explain the principles of the invention. In the drawings:

FIGS. 2B–2E show measured optical aberrations of the lens arrangement shown in FIG. 2A.

FIGS. 4B–4E show measured optical aberrations of the lens arrangement shown in FIG. 4A.

DETAILED DESCRIPTION

Figure 1A:
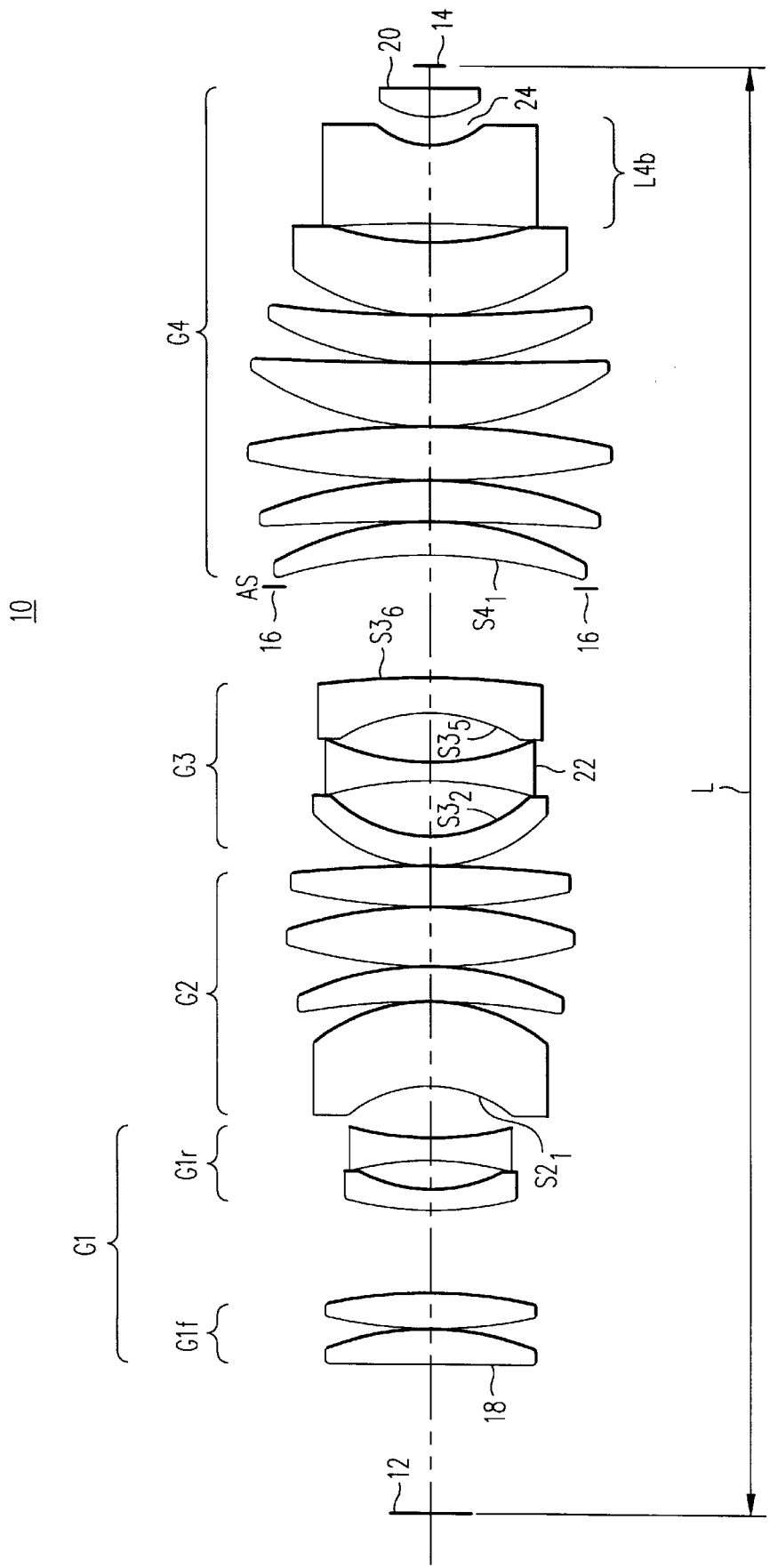
FIG. 1A shows a lens arrangement according to a first embodiment of the present invention.
Figure 1B:
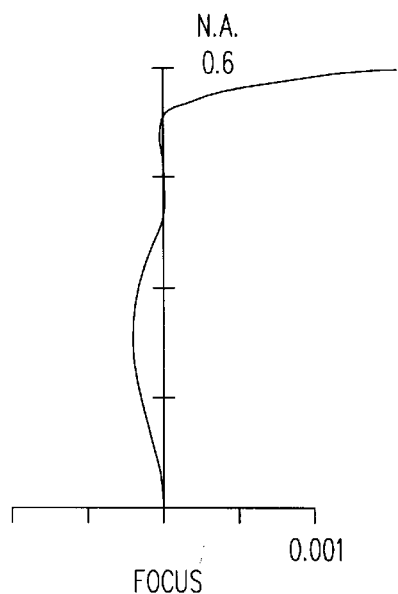
FIGS. 1B–1E show measured optical aberrations of the lens arrangement shown in FIG. 1A.
Figure 1C:
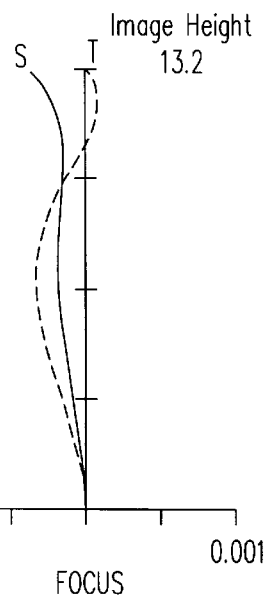
Figure 1D:
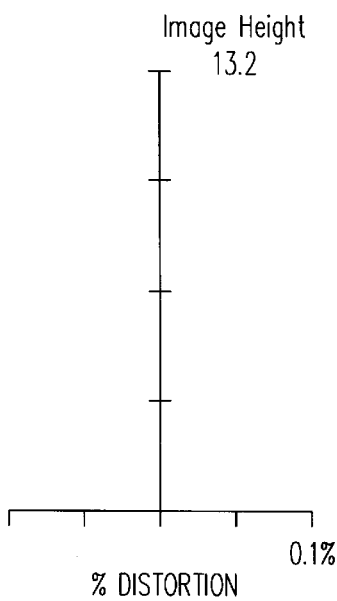
Figure 1E:
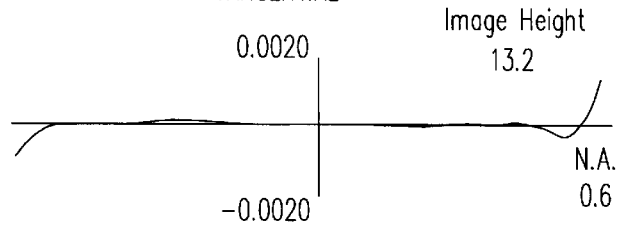
Figure 1E:
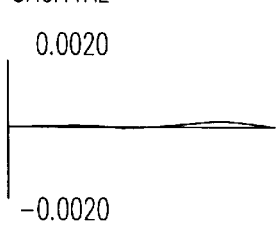

Referring now to the Figures, the embodiments of the present invention will now be described. FIG. 1A shows an optical system lens arrangement according to a first embodiment of the present invention. According to standard practice in the optical art, drawings of optical system lens arrangements, such as those shown in the Figures, have the object space, defined as all the space from the first element or surface of a system towards the object and beyond, on the left in the drawing; therefore, the image space is on the right side of the drawing. Shown in FIG. 1A is an object 12 in object space and an image 14 in image space.

The lens arrangement 10 in FIG. 1A, viewed from the object side, in order of succession, includes a first group of lenses G1, a second group of lenses G2 with an overall positive refractive power, a third group of lenses G3 with an overall negative refractive power, a fourth group of lenses G4 with an overall positive refractive power, and an aperture stop AS, indicated at 16, disposed between lens group G3 and lens group G4.

In order to make the lens system 10 in FIG. 1A telecentric in both image space and object space, the following conditions are satisfied:

$$|En|<L; \text{ and}$$

$$|Ex|>|L/\beta|,$$

wherein L is the distance between object 12 and image 14 of the optical system 10, En is the distance measured from the first optical surface 18 on the object side of optical system 10 to an entrance pupil (not shown), Ex is the distance measured from the last optical surface 20 on the image side of optical system 10 to an exit pupil (not shown), and β is the overall magnification of the optical system 10.

The condition |En|>L establishes an entrance pupil position where the entrance pupil is defined as the image of the aperture stop AS 16 as seen from object space. If the condition |En|>L is not satisfied, an angle of the chief ray emerging from the object plane cannot be made small and, thus, image distortion on the image plane caused by a deflection of the object plane is not negligible and is difficult to compensate. A chief ray is any ray in the object space that passes through the center of the entrance pupil.

The condition $|Ex|>|L/\beta|$ establishes an exit pupil position where the image of the aperture stop AS 16 as seen from image space, is known as the exit pupil of the system. If the condition $|Ex|>|L/\beta|$ is not satisfied, an image distortion caused by deflection in the wafer is not negligible and is difficult to compensate.

In order to have both image space and object space telecentric in an optical system, it is necessary to have a lens group with an overall positive refractive power arranged on the object side of the optical system and a lens group with an overall positive refractive power arranged on the image side with an aperture stop between them. The positioning of lens groups on the object side and the image side of an aperture stop allows the placement of the entrance pupil and the exit pupil at virtual infinity by the proper selection of lenses in both the positive refractive power lens groups and the remaining lenses in the optical system.

In order to obtain high resolution and a wide exposure area at the same time, image field curvature has to be substantially eliminated. When a lens is corrected for spherical aberration and coma, it is termed an aplanat. When it is also corrected for astigmatism, it is termed an anastigmat. Even when these three major aberrations are corrected, the system may still have an aberration called image field curvature. In an anastigmat, the tangential and sagittal surfaces collapse to a single image surface called the Petzval surface which, unfortunately, does not resemble the shape of the object surface which is usually flat, especially in the semiconductor industry in which the object field is the reticle. In a positive refractive power lens system which has image field curvature, a real image will be found on a surface curving toward the object. The radius of curvature of the image surface is called the Petzval radius, and the aberration is called Petzval curvature or field curvature. An expression of the Petzval theorem, which is well known to a person of ordinary skill in the optical art and can be found in various optics textbooks, for example, *Elements of Modern Optical Design,* by Donald C. O'Shea, Wiley Interscience, John Wiley & Sons, New York, 1985, pp. 198–202, contains a summation term known as the Petzval sum. The image field curvature and the Petzval sum are closely related in that the image field curvature aberration can be decreased by decreasing the Petzval sum. The Petzval sum can be decreased by strengthening the negative refractive power at a point where the height of a marginal ray from an axial object point is minimal. A marginal ray is defined as an axial ray traced near the outer edge of a lens system. An axial ray is defined as a ray that starts at an angle from the optic axis in the object plane. A marginal ray, therefore, is a ray that starts on the optic axis in the object plane at an angle that allows the ray to just get through the optical system. Any ray that starts at a larger angle will be blocked by some element, such as the aperture stop, in the optical system. The lens arrangement shown in FIG. 1A is constructed so as to locate a group of lenses G3 with a negative refractive power near the aperture stop AS 16. The lens group G3 is disposed between the positive refractive power group of lenses G2 and the positive refractive power group of lenses G4. However, simply arranging a group of lenses with an overall negative refractive power near an aperture stop in an optical system with a large projection magnification ratio with groups of positive refractive power lenses on either side of the negative refractive power group of lenses would result in a longer distance between an object and an image, and such a reduction projection lens system would be impractical for use in the semiconductor manufacturing industry. Therefore, another group of lenses is necessary to maintain the required compactness of the projection optical system to be used in a semiconductor manufacturing system. This added group of lenses is located on the most object side of the optical system, and in FIG. 1A this additional group of lenses is G1. The group of lenses G1 acts as a reduction afocal relay system for a chief ray which emerges from an object almost parallel to the optical axis. An afocal system is one in which the object and image are both located at infinity. The near afocal lens group G1 enables a large reduction in entrance and exit chief ray heights while maintaining a near parallel condition with the optical axis. This is because the additional lens group G1 is designed with substantially no refractive power and, therefore, does not contribute significantly to the refractive power of the optical system as a whole. The lens group G1 allows the height of the chief ray to be changed significantly which allows the system to have a large projection magnification ratio while maintaining a desired distance between the object and the image, that is, between the reticle and the wafer.

In order to obtain the necessary weak refractive power in the first group of lenses G1, the following conditions are satisfied preferably:

$$-2.3<\beta 1/\beta<-1.6 \text{ and}$$

$$|f1|>L,$$

wherein $\beta 1$ is a magnification of the first group of lenses G1 and f1 is the focal length of the first group of lenses.

For discussion purposes, the first group of lenses G1 is divided into two lens groups. From the object side, in order of succession, there is a front group of lenses G1*f* with a positive refractive power and a rear group of lenses G1*r* with a negative refractive power.

The condition $-2.3<g1/g<-1.6$ provides for the ratio of the magnification $\beta 1$ of the first group of lenses G1 to the magnification $\beta$ of the overall optical system. At above the upper limit of the condition $-2.3<\beta 1/\beta<-1.6$, the magnification ratio of the first group of lenses G1 becomes small, and a large difference in height of the chief ray cannot be achieved which results in making the distance L between the object and image too large. On the other hand, below the limit of the condition $-2.3<\beta 1/\beta<-1.6$, although the difference in height of a chief ray can be achieved, the refractive power of the front group of lenses G1*f* and the rear group of lenses G1*r* becomes too strong to sufficiently compensate for distortion and coma aberration. Because of this, the magnification of the first lens group G1 is set to satisfy the condition $-2.3<\beta 1/\beta<-1.6$. In addition, because the optical system of the present invention is virtually telecentric on both the image and object sides, the condition $|f1|>L$, although providing directly for the focal length f1, provides indirectly for an angle of a chief ray emerging from the first group of lenses G1. Beyond the range of the condition $|f1|>L$, where the refractive power of the first group of lenses G1 becomes too strong on the negative side, the variation of the angle of the chief ray in the first group of lenses G1 becomes too large. This makes it difficult to adequately compensate for distortion. On the other hand, at a focal length beyond the range of the condition $|f1|>L$, where the refractive power of the first group of lenses G1 becomes too strong on the positive side, and contrary to the situation above, it will be convenient to compensate for distortion; however, the difference between an angle of refraction of a chief ray emerging from the first group of lenses G1 and an angle of refraction of the marginal ray, becomes too large which makes it difficult to compensate for coma.

In the first embodiment shown in FIG. 1A, G1*f* includes two lenses with positive refractive power and G1*r* includes two lenses with negative refractive power. One lens in each group could be used; however, using only one positive refractive power lens in G1f could result in the curvature of each optical surface of the single lens to be too strong to compensate for distortion adequately while controlling an angle of a chief ray in order to have an optical system whose object side is as close to telecentric as possible. If only one lens is used in the rear group G1r of the first group G1 of lenses, the curvature at each optical surface could become too strong to adequately compensate for coma. This is because the angle of incidence of the marginal ray from an off-axis object, in particular, becomes too large.

Here, it is preferred that the second group of lenses G2 has a positive refractive power and satisfies the following condition:

$$0.1 < f2/L < 0.2,$$

wherein f2 is the focal length of the second group of lenses G2. At below the lower limit of $0.1 < f2/L < 0.2$, the positive refractive power of the second group of lenses G2 becomes too strong which would necessitate increasing the negative refractive power of the rear group of lenses G1r of the first group of lenses G1 and the negative refractive power of the third group of lenses G3 sufficiently to balance the increase in the positive power necessary to go below the lower limit of condition $0.1 < f2/L < 0.2$. The requirement to maintain the positive and negative refractive power balance is to maintain the compensation for the Petzval sum as discussed above. At above the upper limit of the condition $0.1 < f2/L < 0.2$, the positive refractive power of the second group of lenses G2 becomes too weak and because the negative refractive powers of the rear group of lenses G1r of the first group of lenses G1 and G3 cannot be made strong enough to compensate for the decrease in the positive refractive power of G2, the Petzval sum becomes large. This makes it difficult to adequately compensate for the image field curvature.

In the first embodiment of the lens system shown in FIG. 1A, the second group of lenses G2 includes three positive refractive power lenses with the first optical surface $S2_1$ on the first lens in the second group of lenses G2 being concave facing the object side. It may be possible to have less than three positive refractive power lenses in the second group of lenses G2; however, if there are less than three positive refractive power lenses, the curvature of each optical surface must be too strong to maintain the positive refractive power of the second group of lenses G2 to satisfy the condition $0.1 < f2/L < 0.2$. In addition, it becomes difficult to compensate for the coma and spherical aberration that would be caused by the strong curvature of these optical surfaces. For this reason, it is desirable that the necessary positive refractive power of the second group of lenses G2 be divided amongst at least three positive refractive power lenses. The reason the first optical surface in the second lens group G2 is concave and faces the object side is to decrease the angle of incidence of the ray bundle from the first group of lenses G1 onto the second group of lenses G2. The small angle of incidence assists in keeping coma and spherical aberration small.

In the first embodiment shown in FIG. 1A, the third group of lenses G3 is a lens group with an overall negative refractive power disposed on the object side of aperture stop AS 16. The third group of lenses G3 is arranged more preferably to satisfy the condition:

$$-0.12 < f3/L < -0.06,$$

wherein f3 is the focal length of the third group of lenses G3. Above the upper limit of the condition $-0.12 < f3/L < -0.06$ the negative refractive power of the third group of lenses G3 becomes too strong and, although it is advantageous for compensating for the Petzval sum, it makes compensating for coma and spherical aberration more difficult. On the other hand, below the lower limit of the condition $-0.12 < f3/L < 0.06$, the negative refractive power of the third group of lenses G3 becomes too weak, and the compensation of the Petzval sum becomes insufficient. This means that compensating for the image field curvature is made more difficult. The embodiment shown in FIG. 1A, shows a pair of concave optical surfaces $S3_2$ and $S3_1$ with a negative refractive power lens 22 between the two concave optical surfaces $S3_2$ and $S3_5$.

The placement of third lens group G3 with an overall negative refractive power between second lens group G2 and fourth lens Group G4, each having positive refractive power, causes a marginal ray from the axial object point to have a minimum value, and the arrangement of the concave optical surfaces facing each other in such a manner as to maintain the minimum value results in allowing an angle of incidence with respect to a ray bundle to be small, while strengthening the curvature of the optical surface with negative refractive power. By strengthening this surface, the Petzval sum is made small and thus, coma caused by these lenses is made as small as possible. By having at least one negative refractive power lens 22 located between the pair of concave optical surfaces $S3_2$ and $S3_5$, the negative refractive power borne by each individual lens surface which is required to compensate for the Petzval sum is reduced. This, in turn, minimizes the individual surface contribution to coma aberration.

In addition to minimizing the above discussed aberrations, if the shape factor q of the negative refractive power lens 22 satisfies the condition $q < -0.2$, astigmatism can be minimized provided that the shape factor is defined by the following equation:

$$q=(C1+C2)/(C1-C2),$$

wherein the curvature of the first optical surface from the object side of each lens is C1, and the curvature of the second optical surface is C2.

The ratio between the composite focal length of the groups of lenses on the object side of the aperture stop AS 16 and the composite focal length of the group of lenses on the image side of the aperture stop AS 16 is made as close to the desired projection magnification as possible in order to reduce the aberration caused by the structure of the optical system. Therefore, the third group of lenses G3 is placed on the object side of aperture stop AS 16 such that the higher magnification ratio can be accommodated. The negative refractive power lens disposed between the pair of concave optical surfaces $S3_2$ and $S3_5$ weakens the component working against the symmetric property around aperture stop AS 16 by making the curvature of the concave optical surface $S4_1$, located on the object side of the fourth lens group G4, somewhat weak which contributes to reducing the difference between the meridional image point and the sagittal image point which contributes to the compensation of astigmatism.

If possible, it is desirable to have the shape factor q of the negative refractive power lens 22 satisfy the condition $q > -1$. Below this lower limit the symmetric property of the lenses on either side of the aperture stop AS 16 is improved; however, compensation of the Petzval sum and coma aberration becomes more difficult.

In the first embodiment shown in FIG. 1A, the fourth group of lenses G4 is a group of lenses with an overall positive refractive power arranged on the image side of aperture stop AS 16. To adequately compensate for the Petzval sum, the projection optical system is arranged more preferably to satisfy the following conditions:

$2<\beta4/\beta<3$ and $\delta34/L>0.05$, wherein β4 is the magnification of the fourth group of lenses G4 and δ34 is the axial space between the last optical surface $S3_6$ of the third group of lenses G3 and the first optical surface $S4_1$ of the fourth group of lenses. The negative refractive power of the third group of lenses G3 can be increased and the Petzval sum compensated by having a large difference in height of the marginal ray at the third group of lenses G3 with an overall negative refractive power and at the fourth group of lenses G4 with a positive refractive power. The condition δ34/L>0.05 sets axial distance δ34 and, together with condition 2<β4/β<3, provides that the incident angle of the slope of the paraxial marginal ray is within an appropriate range in order to obtain a sufficient difference in height of the paraxial marginal ray.

The condition 2<β4/β<3 directly provides for the ratio of the magnification β4 of the fourth group of lenses G4 to the magnification β of the optical system 10. However, because the magnification β and the numerical aperture on the image side are already determined, the condition 2<β4/β<3 provides for the angle of the paraxial marginal ray of the ray bundle incident on the fourth group of lenses G4.

Below the lower limit of condition 2<β4/β<3, an angle of the paraxial marginal ray of the ray bundle incident on the fourth group of lenses G4 is too small to obtain a sufficient difference in height of the paraxial marginal ray. Therefore, the height of the marginal ray at the third group of lenses G3 is not small enough to strengthen the negative refractive power, and the Petzval sum cannot be compensated enough to adequately compensate the field curvature.

Above the upper limit of condition 2<β4/β<3, the angle of the paraxial marginal ray of the ray bundle incident on the fourth group of lenses G4 is too large; and, although it is convenient for the compensation of the Petzval sum, the coma aberration generated there cannot be adequately compensated because the negative refractive power of the third group of lenses G3 is too strong.

Below the lower limit of condition δ34/L>0.05, the Petzval sum is not being adequately compensated due to the lack of the difference in height of the paraxial marginal ray. It is furthermore desirable to set the upper limit of condition δ34/L>0.05 at 0.1 to more adequately balance the limit of the distance L between the object and the image and the compensation for optical aberrations.

In order for the fourth group of lenses G4 to receive the ray bundle diverged by the third group of lenses G3, the angle of the ray bundle within the fourth group of lenses G4 should be changed gradually to minimize the angle of incidence at each lens surface in the fourth group of lenses G4. Therefore, the fourth group of lenses G4 is preferably arranged to satisfy the condition $0.09<f4/L<0.16$, wherein f4 is the focal length of the fourth group of lenses G4.

At a ratio below the lower limit of condition 0.09<f4/L<0.16, the focal length f4 of the fourth group of lenses G4 is too short and the length of the fourth group of lenses G4 is short which would be advantageous in reducing the overall size of the optical system 10; however, because the positive refractive power of the fourth group of lenses becomes too strong, it would be difficult to compensate for various optical aberrations, in particular, coma and spherical aberration.

At a ratio above the upper limit of condition 0.09<f4/L<0.16, the focal length f4 of the fourth group of lenses G4 is too long and the distance from the aperture stop AS 16 to the image plane becomes longer and would cause the size of the optical system to become larger, which is undesirable.

The first embodiment shown in FIG. 1A includes six positive refractive power lenses in the fourth group of lenses G4 and a negative refractive power lens L4b with a concave optical surface 24 facing the image side. The six positive refractive power lenses share the required strong positive refractive power allowing the angle of the ray bundle within the fourth group of lenses G4 to be changed gradually to minimize the angle of incidence at each optical surface in the fourth group of lenses G4. Another reason to have at least six positive refractive power lenses in the fourth group of lenses G4 is that because the fourth group of lenses G4 receives an expanded ray bundle from the third group of lenses G3, the contribution of the fourth group of lenses G4 to spherical aberration can be significant and cannot be adequately compensated unless there are a significant number of positive refractive power lenses in the fourth group of lenses G4. By having the concave surface of the negative refractive power lens L4b facing the image side, the angle of incidence with respect to the ray bundle with a large numerical aperture converged at an image point can be made small which makes the various optical aberrations small. To achieve this, the lens L4b is arranged more preferably to satisfy the following condition:

$|f4b/L|<0.13$, wherein f4b is the focal length of the negative refractive power lens L4b.

At beyond the range of the condition |f4b/L|<0.13, the negative refractive power becomes too weak and it is difficult to adequately compensate for coma and spherical aberration. Example 1 is a listing of numerical values for Embodiment 1 shown in FIG. 1A. The optical surfaces are numbered from the object side to the image side, each lens of course having two surfaces. It is noted that in the following examples, a single glass material, fused silica $(SiO_2)$ with an index of refraction of 1.5084 at the wavelength λ of 248 mm, is used as the optical material for all lenses of the projection optical system.

EXAMPLE 1

Object plane to first optical surface = 100.000 mm
Last optical surface to image plane = 15.203 mm

| | | |
|---|---|---|
| En = 2890.681 mm | Ex = 4431.639 mm | f1 = −12368.327 mm |
| f2 = 147.910 mm | f3 = −100.116 mm | f4 = 141.728 mm |
| β1 = 0.5401 | β4 = −0.6267 | q32 = −0.3415 |
| f4b = −98.205 mm | δ34 = 83.771 mm | β = −0.25 |
| L = 980.000 mm | | |

| Surface # | Radius of curvature (mm) | axial distance (mm)* | lens material |
|---|---|---|---|
| 1 | Infinity | 21.972 | $SiO_2$ |
| 2 | −219.5343 | 0.500 | |
| 3 | 418.1439 | 22.903 | $SiO_2$ |
| 4 | −372.1487 | 55.092 | |
| 5 | 228.2689 | 13.200 | $SiO_2$ |
| 6 | 92.9574 | 20.901 | |
| 7 | −242.8683 | 13.200 | $SiO_2$ |
| 8 | 152.7388 | 35.238 | |
| 9 | −83.6596 | 54.246 | $SiO_2$ |

-continued

| | | | |
|---|---|---|---|
| 10 | -137.0918 | 0.500 | |
| 11 | -527.7039 | 22.786 | SiO$_2$ |
| 12 | -211.5084 | 0.500 | |
| 13 | 305.1996 | 39.999 | SiO$_2$ |
| 14 | -309.0586 | 0.500 | |
| 15 | 326.3851 | 27.483 | SiO$_2$ |
| 16 | 1029.3143 | 0.500 | |
| 17 | 101.2218 | 20.693 | SiO$_2$ |
| 18 | 90.6354 | 39.144 | |
| 19 | -267.5363 | 13.200 | SiO$_2$ |
| 20 | 131.3186 | 35.422 | |
| 21 | -113.1086 | 22.457 | SiO$_2$ |
| 22 | -743.8803 | 65.268 | |
| AS | Infinity | 18.503 | |
| 23 | -377.6071 | 23.981 | SiO$_2$ |
| 24 | -215.1420 | 0.500 | |
| 25 | 2352.6425 | 27.858 | SiO$_2$ |
| 26 | -316.8095 | 0.500 | |
| 27 | 500.0254 | 36.719 | SiO$_2$ |
| 28 | -566.9346 | 0.500 | |
| 29 | 201.8472 | 42.566 | SiO$_2$ |
| 30 | 1337.8302 | 0.500 | |
| 31 | 196.1627 | 32.164 | SiO$_2$ |
| 32 | 598.1194 | 0.500 | |
| 33 | 139.3671 | 50.074 | SiO$_2$ |
| 34 | 213.1926 | 11.440 | |
| 35 | 9000.0000 | 50.040 | SiO$_2$ |
| 36 | 49.5517 | 18.833 | |
| 37 | 48.0703 | 20.415 | SiO$_2$ |
| 38 | 1571.0501 | | |

*The axial distance is either axial lens thickness or axial distance between adjacent lenses (along the optical axis).

En is the distance measured from the first optical surface on the object side of the optical system to the entrance pupil of the optical system, Ex is the distance measured from the last optical surface on the image side of the optical system to the exit pupil of the optical system, f1 is the focal length of the first group of lenses G1, f2 is the focal length of the second group of lenses G2, f3 is the focal length of the third group of lenses G3, f4 is the focal length of the fourth group of lenses G4, β1 is the magnification of the first group of lenses, β4 is the magnification of the fourth group of lenses, q32 is the shape factor of the negative refractive power lens in the third group of lenses, f4b is the focal length of the negative refractive power lens in the fourth group of lenses, δ34 is the axial distance from the last optical surface of the third group of lenses to the first optical surface of the fourth group of lenses, β is the overall magnification of the optical system, and L is the distance between object and image of the optical system.

The embodiments of the present invention shown in FIGS. 1A–7E are shown with measured aberrations for each of the seven embodiments. The measurements were made with a projection optical system of the present invention using a KrF excimer laser with a wavelength of 248 nanometers, a system magnification of 0.25, an image side numerical aperture of 0.6, and a diameter of the image side exposure area is 26.4 millimeters. FIGS. 1B to 1E show measured optical aberrations of the lens arrangement as shown in FIG. 1A.

Referring now to FIGS. 2A–7E, embodiments 2 through 7 will now be explained. In each of the Figures, like numerical designations will be the same for like components as shown in FIG. 1A.

Figure 2A:
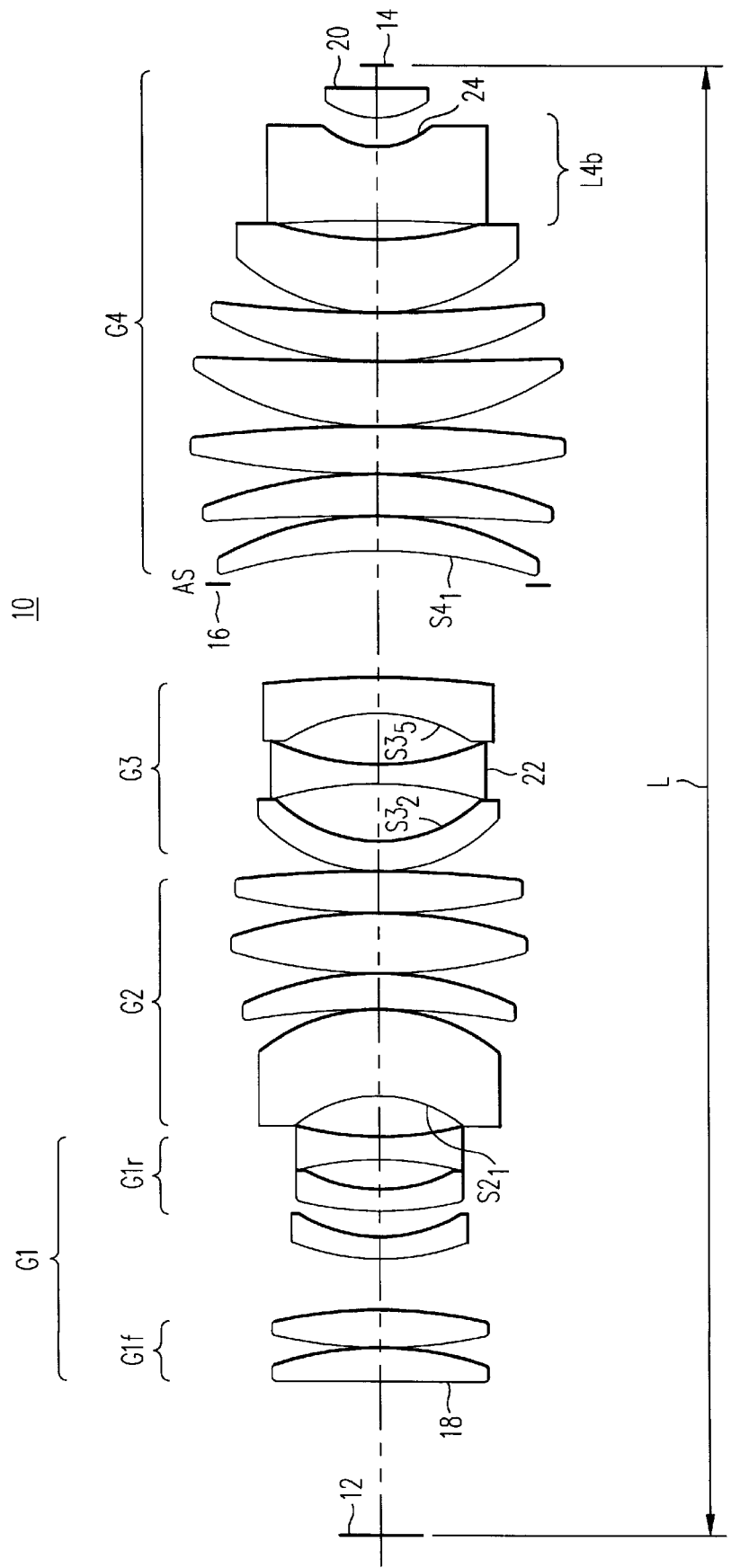
FIG. 2A shows a lens arrangement according to a second embodiment of the present invention.

FIG. 2A shows a second embodiment of the present invention. Embodiment 2 differs from embodiment 1 in that embodiment 2 has three negative refractive power lenses in the rear group G1r of the first group of lenses G1, whereas embodiment 1 has two negative refractive power lenses. The added negative refractive power lens provides improved aberration compensation. FIGS. 2B to 2E show measured optical aberrations of the lens arrangement shown in FIG. 2A. Example 2 is a listing of numerical values for Embodiment 2 shown in FIG. 2A.

EXAMPLE 2

Object plane to first optical surface = 100.005 mm
Last optical surface to image plane = 15.146 mm
En = 3167.690 mm   Ex = 4499.500 mm   f1 = -7786.016 mm
f2 = -143.587 mm   f3 = -96.931 mm    f4 = 140.130 mm
β1 = 0.532         β4 = -0.6267       q32 = -0.3580
f4b = -100.376 mm  δ34 = 83.250 mm    β = -0.25
L = 980.004 mm

| Surface # | Radius of Curvature (mm) | axial distance (mm)* | lens material |
|---|---|---|---|
| 1 | 2885.7578 | 22.338 | SiO$_2$ |
| 2 | -225.8625 | 0.500 | |
| 3 | 292.3214 | 23.235 | SiO$_2$ |
| 4 | -570.9909 | 32.507 | |
| 5 | 171.9983 | 13.200 | SiO$_2$ |
| 6 | 102.7355 | 15.520 | |
| 7 | 247.7947 | 13.200 | SiO$_2$ |
| 8 | 112.8554 | 17.339 | |
| 9 | -285.1155 | 19.524 | SiO$_2$ |
| 10 | 184.7278 | 30.188 | |
| 11 | -82.8626 | 55.022 | SiO$_2$ |
| 12 | -133.2816 | 0.500 | |
| 13 | -558.7588 | 23.285 | SiO$_2$ |
| 14 | -211.8646 | 0.500 | |
| 15 | 287.9933 | 38.933 | SiO$_2$ |
| 16 | -360.6154 | 0.500 | |
| 17 | 291.9108 | 29.232 | SiO$_2$ |
| 18 | -1047.2563 | 0.500 | |
| 19 | 101.2961 | 20.417 | SiO$_2$ |
| 20 | 90.4508 | 38.782 | |
| 21 | -272.8878 | 13.200 | SiO$_2$ |
| 22 | 129.0010 | 34.605 | |
| 23 | -115.4078 | 22.894 | SiO$_2$ |
| 24 | -1276.1960 | 65.482 | |
| AS | Infinity | 17.768 | |
| 25 | -390.0579 | 23.653 | SiO$_2$ |
| 26 | -217.6774 | 0.500 | |
| 27 | 5786.7268 | 30.606 | SiO$_2$ |
| 28 | -324.3366 | 0.500 | |
| 29 | 528.2130 | 34.304 | SiO$_2$ |
| 30 | -596.4222 | 0.500 | |
| 31 | 195.3567 | 42.014 | SiO$_2$ |
| 32 | 1173.4808 | 0.500 | |
| 33 | 195.0500 | 30.775 | SiO$_2$ |
| 34 | 544.8555 | 0.500 | |
| 35 | 136.8421 | 47.721 | SiO$_2$ |
| 36 | 209.9488 | 11.371 | |
| 37 | 4581.9271 | 51.322 | SiO$_2$ |
| 38 | 50.2785 | 19.402 | |
| 39 | 48.9832 | 22.014 | SiO$_2$ |
| 40 | 2090.6182 | | |

*The axial distance is either axial lens thickness or axial distance between adjacent lenses.

En is the distance measured from the first optical surface on the object side of the optical system to the entrance pupil of the optical system, Ex is the distance measured from the last optical surface on the image side of the optical system to the exit pupil of the optical system, f1 is the focal length of the first group of lenses G1, f2 is the focal length of the second group of lenses G2, f3 is the focal length of the third group of lenses G3, f4 is the focal length of the fourth group of lenses G4, β1 is the magnification of the first group of lenses, β4 is the magnification of the fourth group of lenses, q32 is the shape factor of the negative refractive power lens in the third group of lenses, f4b is the focal length of the negative refractive power lens in the fourth group of lenses, δ34 is the axial distance from the last optical surface of the third group of lenses to the first optical surface of the fourth group of lenses, β is the overall magnification of the optical system, and L is the distance between object and image of the optical system.

Figure 3A:
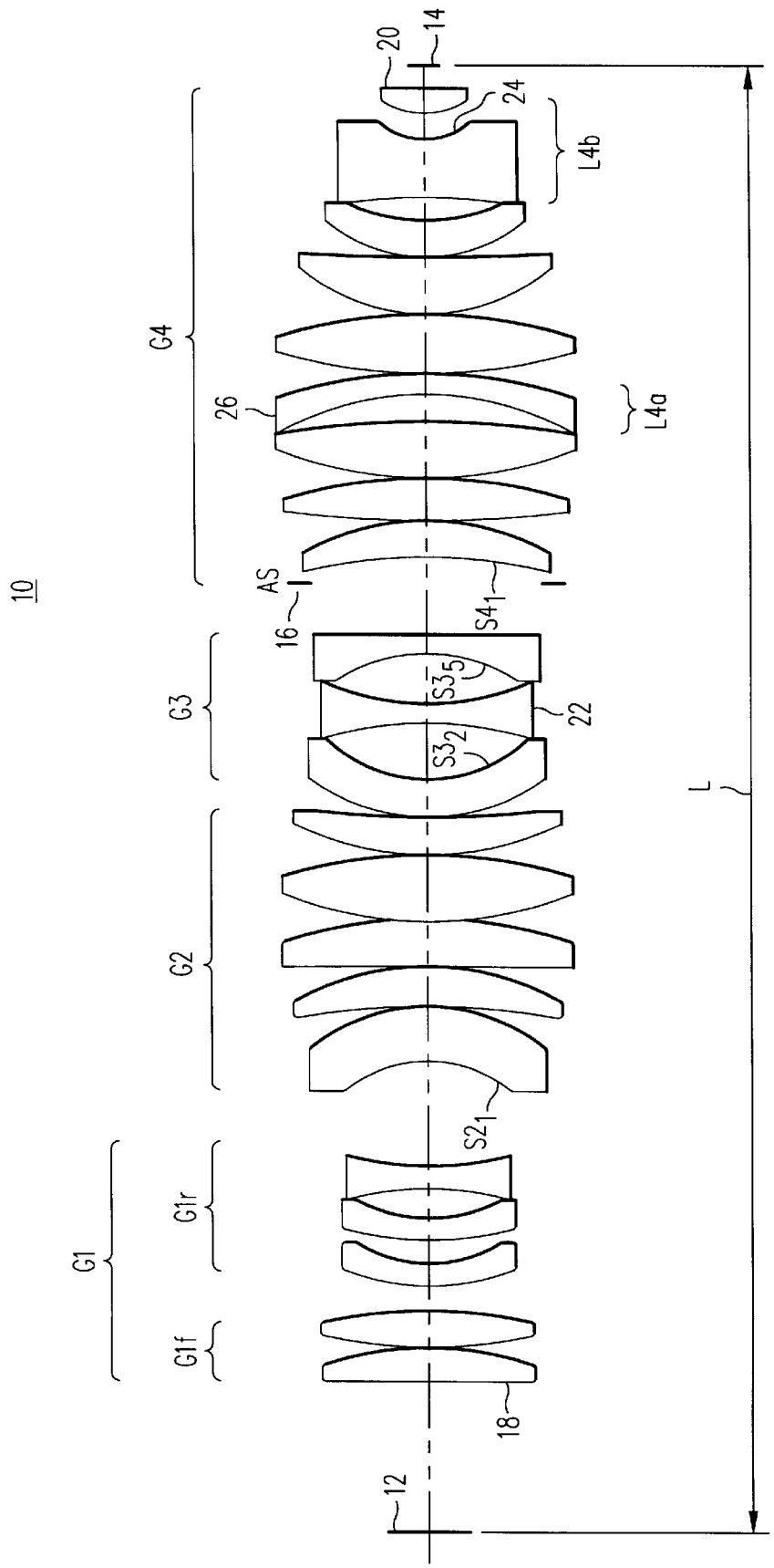
FIG. 3A shows a lens arrangement according to a third embodiment of the present invention.
Figure 3B:
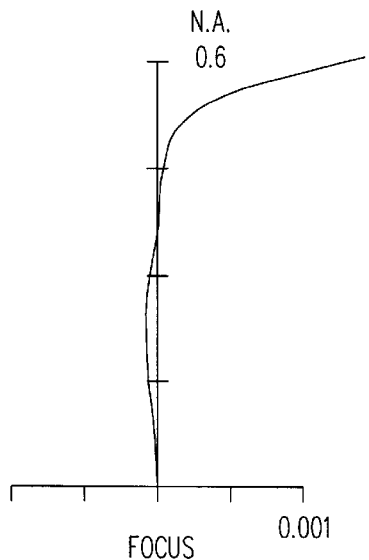
FIGS. 3B–3E show measured optical aberrations of the lens arrangement shown in FIG. 3A.
Figure 3C:
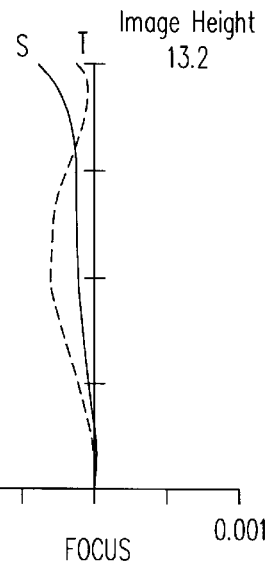
Figure 3D:
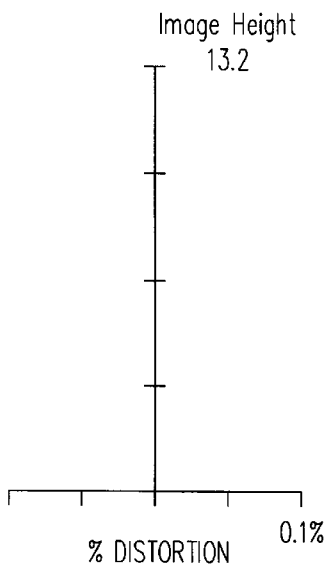
Figure 3E:
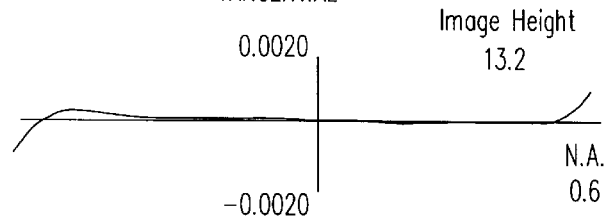
Figure 3E:
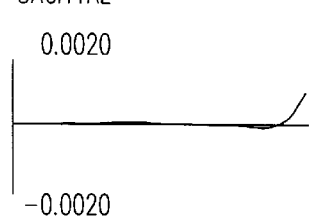

FIG. 3A shows a third embodiment of the present invention. The third embodiment includes four positive refractive power lenses in the second group of lenses G2. The addition of a positive refractive power lens to embodiment 3 allows the curvature of each positive refractive power lens surface to be weakened which reduces the aberration generated at each surface. A negative refractive power lens 26 is added to the fourth group of lenses G4 at the position where the ray bundle is widest which generates an opposite aberration providing improved refractive power balance. Example 3 is a listing of numerical values for Embodiment 3 shown in FIG. 3A.

EXAMPLE 3

Object plane to first optical surface = 100.022 mm
Last optical surface to image plane = 15.401 mm
En = 3430.501 mm    Ex = 6214.553 mm    f1 = −1629.975 mm
f2 = 132.791 mm     f2 = 132.791 mm     f3 = −83.063 mm
f4 = 122.333 mm     $\beta1$ = 0.478    $\beta4$ = −0.6267
q32 = −0.2500       f4b = −92.242 mm    $\delta34$ = 51.719 mm
h4a = 85.103 mm     h4max = 91.718 mm   f4a = −1102.065 mm
q4a = 3.670         $\beta$ = −0.25     L = 980.001 mm

| Surface # | Radius of Curvature (mm) | axial distance (mm)* | lens material |
|---|---|---|---|
| 1 | 1035.4918 | 23.355 | SiO$_2$ |
| 2 | −243.8838 | 0.882 | |
| 3 | 202.5420 | 26.395 | SiO$_2$ |
| 4 | −583.4769 | 18.415 | |
| 5 | 189.2260 | 13.827 | SiO$_2$ |
| 6 | 109.2412 | 14.229 | |
| 7 | 260.5493 | 13.200 | SiO$_2$ |
| 8 | 112.2878 | 21.138 | |
| 9 | −129.3924 | 13.200 | SiO$_2$ |
| 10 | 162.7234 | 70.326 | |
| 11 | −93.7255 | 35.314 | SiO$_2$ |
| 12 | −130.6305 | 0.500 | |
| 13 | −434.5127 | 24.568 | SiO$_2$ |
| 14 | −189.6052 | 0.500 | |
| 15 | 3472.0293 | 29.708 | SiO$_2$ |
| 16 | −332.9038 | 0.500 | |
| 17 | 279.0422 | 44.078 | SiO$_2$ |
| 18 | −424.5560 | 0.500 | |
| 19 | 233.3057 | 24.361 | SiO$_2$ |
| 20 | 693.7685 | 0.500 | |
| 21 | 147.2276 | 29.622 | SiO$_2$ |
| 22 | 102.9836 | 35.341 | |
| 23 | −223.2687 | 13.200 | SiO$_2$ |
| 24 | 133.9612 | 31.903 | |
| 25 | −126.4786 | 14.396 | SiO$_2$ |
| 26 | −9000.0000 | 36.951 | |
| AS | Infinity | 14.768 | |
| 27 | −490.9308 | 24.929 | SiO$_2$ |
| 28 | −190.8527 | 0.500 | |
| 29 | 698.5103 | 28.798 | SiO$_2$ |
| 30 | −406.1288 | 0.500 | |
| 31 | 261.7071 | 38.226 | SiO$_2$ |
| 32 | −823.4878 | 18.270 | |
| 33 | −233.8363 | 13.200 | SiO$_2$ |
| 34 | −408.9672 | 0.500 | |
| 35 | 353.5677 | 38.745 | SiO$_2$ |
| 36 | −415.4598 | 0.500 | |
| 37 | 138.1435 | 37.331 | SiO$_2$ |
| 38 | 794.2109 | 0.500 | |
| 39 | 121.6915 | 23.093 | SiO$_2$ |
| 40 | 169.5366 | 13.835 | |
| 41 | −980.2205 | 41.588 | SiO$_2$ |
| 42 | 49.9566 | 12.423 | |
| 43 | 49.4098 | 19.963 | SiO$_2$ |
| 44 | 763.1561 | | |

*The axial distance is either axial lens thickness or axial distance between adjacent lenses.

En is the distance measured from the first optical surface on the object side of the optical system to the entrance pupil of the optical system, Ex is the distance measured from the last optical surface on the image side of the optical system to the exit pupil of the optical system, f1 is the focal length of the first group of lenses G1, f2 is the focal length of the second group of lenses G2, f3 is the focal length of the third group of lenses G3, f4 is the focal length of the fourth group of lenses G4, $\beta1$ is the magnification of the first group of lenses, $\beta4$ is the magnification of the fourth group of lenses, q32 is the shape factor of the negative refractive power lens in the third group of lenses, f4b is the focal length of the negative refractive power lens in the fourth group of lenses, $\delta34$ is the axial distance from the last optical surface of the third group of lenses to the first optical surface of the fourth group of lenses, h4a is the maximum height of a paraxial marginal ray on each optical surface of the second negative refractive power lens in the fourth group of lenses, h4max is the maximum height of a paraxial marginal ray in the fourth group of lenses, f4a is the focal length of the second negative refractive power lens of the fourth group of lenses, q4a is the shape factor of the second negative refractive power lens, $\beta$ is the overall magnification of the optical system, and L is the distance between object and image of the optical system.

The fourth group of lenses G4 with the addition of negative refractive power lens 26 satisfies the following condition:

$$h4a/h4max > 0.9,$$

wherein h4a is the maximum height of the paraxial marginal ray at each surface of the negative refractive power lens L4a 26 and h4max is the maximum height of the paraxial marginal ray in the fourth group of lenses G4. By arranging the negative refractive lens L4a 26 within the range of condition h4a/h4max>0.9, the height of the paraxial marginal ray is utilized to control the negative refractive power from becoming too strong which makes it possible to efficiently adjust coma and spherical aberration. In addition, it is desirable for the following conditions to be satisfied:

$$f4a/L < -1 \text{ and}$$

$$3 < q4a < 5,$$

wherein f4a is the focal length of lens L4a 26 and q4a is the shape factor of lens L4a 26. Beyond the range of condition f4a/L<−1, the refractive power is too strong because the height of paraxial marginal ray is large and the contribution of the negative refractive power to the refractive power of the entire system becomes too strong, which in turn requires the positive refractive power to be stronger for balance. The stronger curvatures of the surfaces in the individual lenses would make it more difficult to compensate for high order aberration. Beyond the upper limit of the condition 3<q4a<5, the degree of meniscus of L4a becomes stronger causing the angle of incidence and the angle of refraction of the marginal ray at the negative refractive power lens L4a to become too large to compensate for higher order aberrations. Below the lower limit of the condition 3<q4a<5, aberration cannot be compensated adequately with less negative refractive power and, as a result, the condition f4a/L<−1 becomes more difficult to satisfy. FIGS. 3B to 3E show measured optical aberrations of the lens arrangement as shown in FIG. 3A.

Figure 4A:
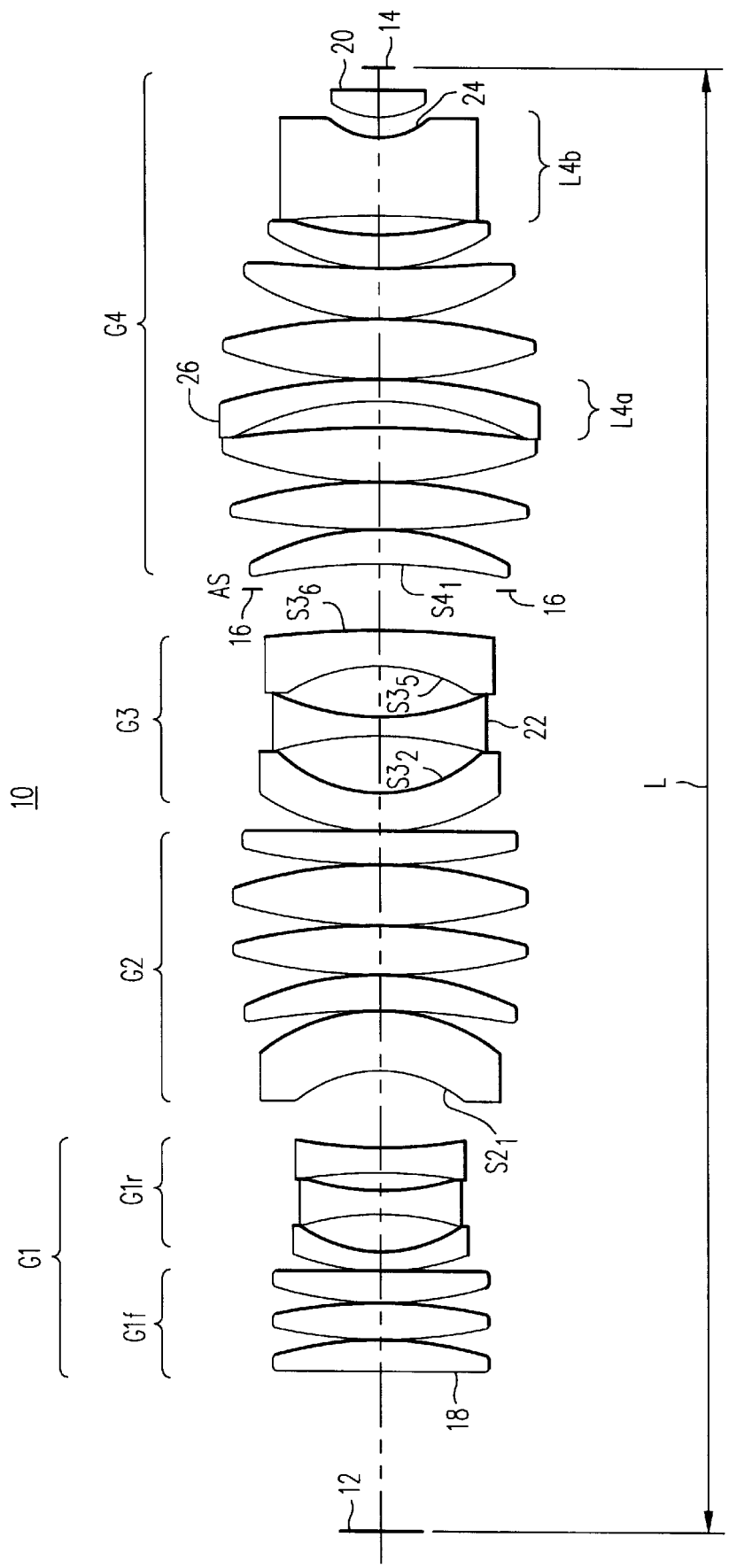
FIG. 4A shows a lens arrangement according to a fourth embodiment of the present invention.

FIG. 4A shows a fourth embodiment of the present invention. The fourth embodiment includes three positive refractive power lenses in the front lens group G1f in the first group of lenses G1. The three positive refractive power lenses allow better compensation of aberrations by dividing up the positive refractive power between three positive refractive power lenses. FIGS. 4B to 4E show measured optical aberrations of the lens arrangement as shown in FIG.

4A. Example 4 is a listing of numerical values for Embodiment 4 shown in FIG. 4A.

EXAMPLE 4

Object plane to first optical surface = 114.250 mm
Last optical surface to image plane = 15.455 mm
En = 4093.415 mm    Ex = −5751.189 mm    f1 = −1593.699 mm
f2 = 126.222 mm     f3 = −79.002 mm      f4 = 119.507 mm
β1 = 0.4826         β4 = −0.6267         q32 = −0.2500
f4b = −91.467 mm    δ34 = 52.620 mm      h4a = 84.294 mm
h4max = 90.239 mm   f4a = −1229.760 mm   q4a = 3.882
β = −0.25           L = 980.001 mm

| Surface # | Radius of Curvature (mm) | axial distance (mm)* | lens material |
|---|---|---|---|
| 1 | 734.3406 | 21.818 | SiO$_2$ |
| 2 | −340.2643 | 0.500 | |
| 3 | 285.4038 | 22.862 | SiO$_2$ |
| 4 | −805.2878 | 0.562 | |
| 5 | 200.3927 | 22.916 | SiO$_2$ |
| 6 | −5488.5929 | 2.017 | |
| 7 | 175.9518 | 13.200 | SiO$_2$ |
| 8 | 89.3671 | 23.506 | |
| 9 | −251.2940 | 13.200 | SiO$_2$ |
| 10 | 117.6377 | 17.782 | |
| 11 | −385.3813 | 13.200 | SiO$_2$ |
| 12 | 202.4207 | 45.924 | |
| 13 | −91.0702 | 37.285 | SiO$_2$ |
| 14 | −127.3432 | 1.121 | |
| 15 | −328.0513 | 21.515 | SiO$_2$ |
| 16 | −189.7883 | 0.500 | |
| 17 | 586.2480 | 32.616 | SiO$_2$ |
| 18 | −361.8688 | 0.500 | |
| 19 | 245.8447 | 42.666 | SiO$_2$ |
| 20 | −473.1517 | 0.500 | |
| 21 | 264.6374 | 23.142 | SiO$_2$ |
| 22 | 1048.3873 | 0.500 | |
| 23 | 148.4737 | 29.015 | SiO$_2$ |
| 24 | 103.0984 | 32.942 | |
| 25 | −206.3282 | 13.200 | SiO$_2$ |
| 26 | 123.7969 | 32.915 | |
| 27 | −131.6399 | 21.033 | SiO$_2$ |
| 28 | 7701.8857 | 36.508 | |
| AS | Infinity | 16.112 | |
| 29 | −464.5546 | 22.943 | SiO$_2$ |
| 30 | −196.3589 | 0.500 | |
| 31 | 550.6776 | 31.300 | SiO$_2$ |
| 32 | −389.3637 | 0.500 | |
| 33 | 267.4490 | 35.966 | SiO$_2$ |
| 34 | −973.8704 | 16.994 | |
| 35 | −249.5509 | 13.200 | SiO$_2$ |
| 36 | −422.7325 | 0.651 | |
| 37 | 292.4468 | 39.221 | SiO$_2$ |
| 38 | −482.4755 | 0.500 | |
| 39 | 142.3114 | 33.754 | SiO$_2$ |
| 40 | 562.9071 | 0.500 | |
| 41 | 127.0463 | 21.871 | SiO$_2$ |
| 42 | 203.4267 | 12.627 | |
| 43 | −1103.3518 | 49.378 | SiO$_2$ |
| 44 | 49.2801 | 10.479 | |
| 45 | 47.7728 | 20.357 | SiO$_2$ |
| 46 | 657.3074 | | |

*The axial distance is either axial lens thickness or axial distance between adjacent lenses.

En is the distance measured from the first optical surface on the object side of the optical system to the entrance pupil of the optical system, Ex is the distance measured from the last optical surface on the image side of the optical system to the exit pupil of the optical system, f1 is the focal length of the first group of lenses G1, f2 is the focal length of the second group of lenses G2, f3 is the focal length of the third group of lenses G3, f4 is the focal length of the fourth group of lenses G4, β1 is the magnification of the first group of lenses, β4 is the magnification of the fourth group of lenses, q32 is the shape factor of the negative refractive power lens in the third group of lenses, f4b is the focal length of the negative refractive power lens in the fourth group of lenses, δ34 is the axial distance from the last optical surface of the third group of lenses to the first optical surface of the fourth group of lenses, h4a is the maximum height of a paraxial marginal ray on each optical surface of the second negative refractive power lens in the fourth group of lenses, h4max is the maximum height of a paraxial marginal ray in the fourth group of lenses, f4a is the focal length of the second negative refractive power lens of the fourth group of lenses, q4a is the shape factor of the second negative refractive power lens, g is the overall magnification of the optical system, and L is the distance between object and image of the optical system.

Figure 5A:
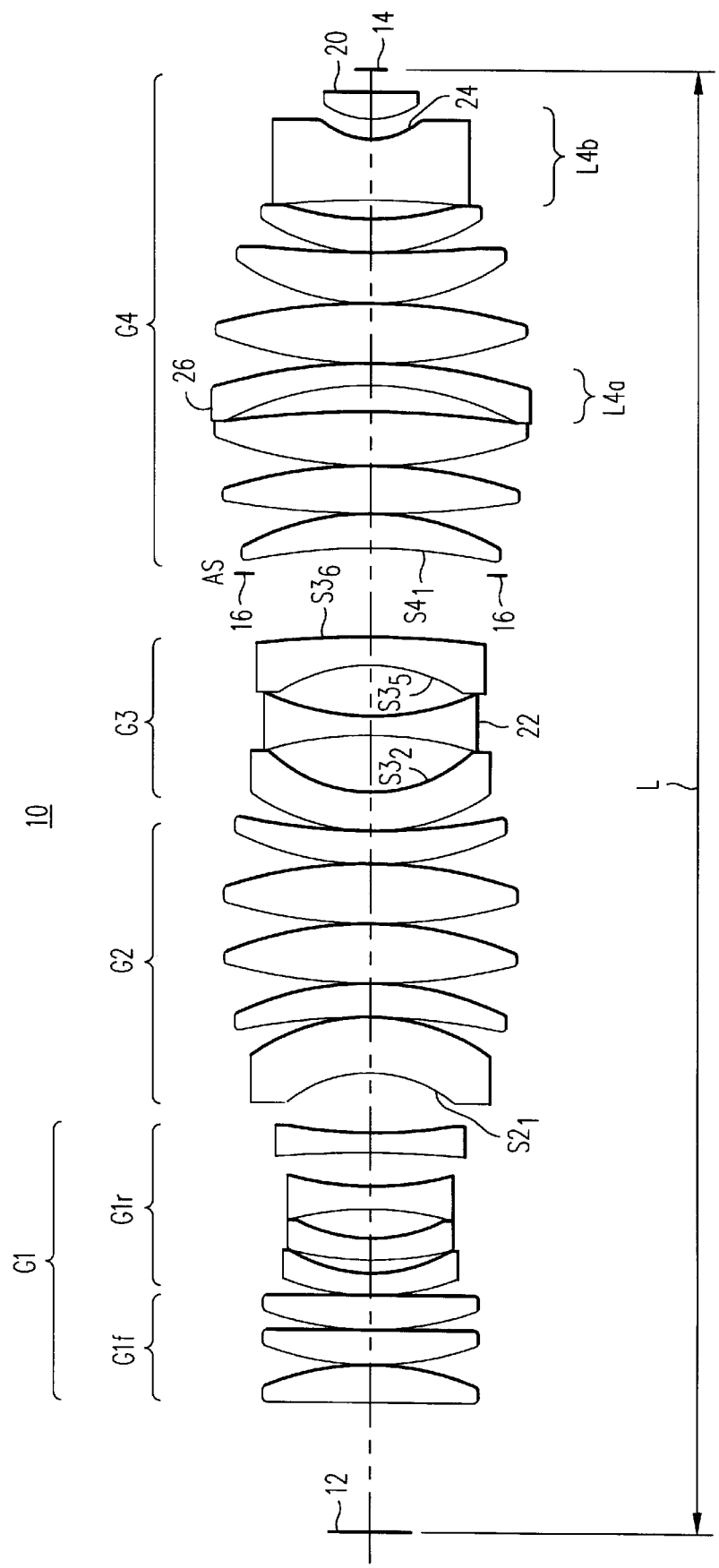
FIG. 5A shows a lens arrangement according to a fifth embodiment of the present invention.
Figure 5B:
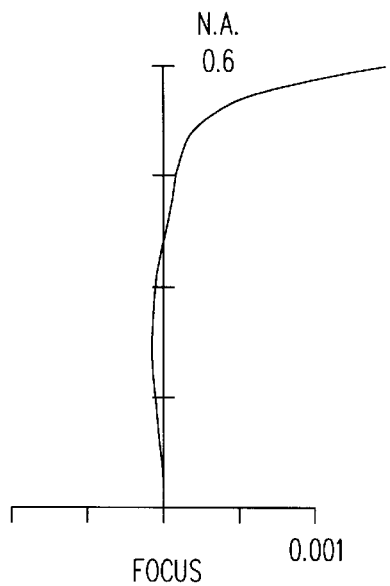
FIGS. 5B–5E show measured optical aberrations of the lens arrangement shown in FIG. 5A.
Figure 5C:
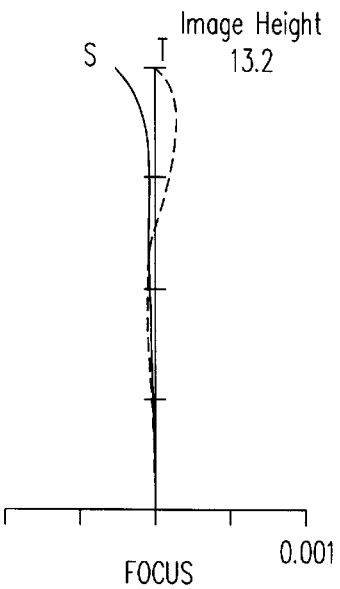
Figure 5D:
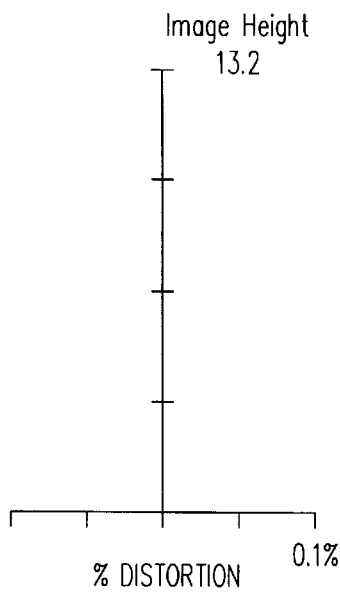
Figure 5E:
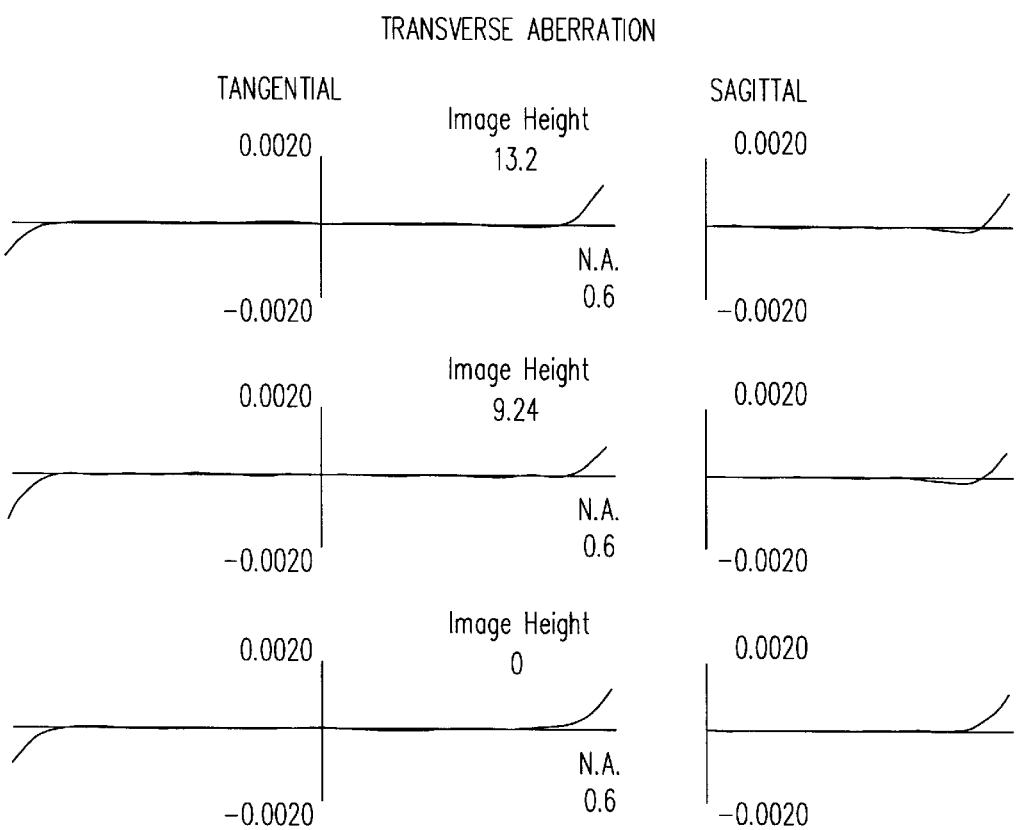

FIG. 5A shows a fifth embodiment of the present invention. The fifth embodiment includes four negative refractive power lenses in rear lens group G1r in the first group of lenses G1. The four negative refractive power lenses allow the required negative refractive power to be divided between four lenses. FIGS. 5B to 5E show measured optical aberrations of the lens arrangement as shown in FIG. 5A. Example 5 is a listing of numerical values for Embodiment 5 shown in FIG. 5A.

EXAMPLE 5

Object plane to first optical surface = 109.084 mm
Last optical surface to image plane = 15.508 mm
En = 3714.136 mm    Ex = −6439.431 mm    f1 = −1409.164 mm
f2 = 128.024 mm     f3 = −81.115 mm      f4 = 115.796 mm
β1 = 0.4608         β4 = −0.6267         q32 = −0.2500
f4b = −93.685 mm    δ34 = 50.705 mm      h4a = 82.568 mm
h4max = 88.303 mm   f4a = −1123.899 mm   q4a = 3.844
β = −0.25           L = 980.000 mm

| Surface # | Radius of Curvature (mm) | axial distance (mm)* | lens material |
|---|---|---|---|
| 1 | 1429.4466 | 23.206 | SiO$_2$ |
| 2 | −237.8825 | 2.679 | |
| 3 | 284.9490 | 18.564 | SiO$_2$ |
| 4 | 2543.1908 | 0.901 | |
| 5 | 182.9345 | 22.354 | SiO$_2$ |
| 6 | 1843.7771 | 0.500 | |
| 7 | 156.9109 | 13.200 | SiO$_2$ |
| 8 | 92.2005 | 10.950 | |
| 9 | 195.3680 | 13.200 | SiO$_2$ |
| 10 | 99.6277 | 20.263 | |
| 11 | −205.8066 | 13.200 | SiO$_2$ |
| 12 | 170.3134 | 22.789 | |
| 13 | −2041.9105 | 13.200 | SiO$_2$ |
| 14 | 250.8359 | 39.135 | |
| 15 | −101.0171 | 38.918 | SiO$_2$ |
| 16 | −138.9455 | 0.500 | |
| 17 | −371.9355 | 21.216 | SiO$_2$ |
| 18 | −208.5422 | 0.500 | |
| 19 | 456.0090 | 37.838 | SiO$_2$ |
| 20 | −334.2789 | 0.500 | |
| 21 | 260.2819 | 40.620 | SiO$_2$ |
| 22 | −571.1082 | 0.500 | |
| 23 | 253.6973 | 22.836 | SiO$_2$ |
| 24 | 738.8543 | 0.500 | |
| 25 | 151.1963 | 30.931 | SiO$_2$ |
| 26 | 103.4086 | 33.478 | |
| 27 | −216.0894 | 13.200 | SiO$_2$ |
| 28 | 129.6536 | 29.657 | |
| 29 | −140.3622 | 15.849 | SiO$_2$ |
| 30 | 1464.5072 | 31.048 | |
| AS | Infinity | 19.657 | |
| 31 | −717.8963 | 25.457 | SiO$_2$ |
| 32 | −195.6305 | 0.500 | |
| 33 | 481.0396 | 28.100 | SiO$_2$ |
| 34 | −570.0658 | 0.500 | |
| 35 | 277.7841 | 35.703 | SiO$_2$ |
| 36 | −762.9426 | 17.046 | |
| 37 | −229.4275 | 13.200 | SiO$_2$ |
| 38 | −390.7874 | 0.500 | |
| 39 | 300.1620 | 38.930 | SiO$_2$ |

-continued

| | | | |
|---|---|---|---|
| 40 | −450.2510 | 0.500 | |
| 41 | 129.3465 | 37.088 | SiO$_2$ |
| 42 | 623.5795 | 0.500 | |
| 43 | 115.7912 | 20.137 | SiO$_2$ |
| 44 | 153.2106 | 14.003 | |
| 45 | −1346.7279 | 35.923 | SiO$_2$ |
| 46 | 49.8199 | 11.440 | |
| 47 | 49.6263 | 23.992 | SiO$_2$ |
| 48 | 591.8956 | | |

*The axial distance is either axial lens thickness or axial distance between adjacent lenses.

En is the distance measured from the first optical surface on the object side of the optical system to the entrance pupil of the optical system, Ex is the distance measured from the last optical surface on the image side of the optical system to the exit pupil of the optical system, f1 is the focal length of the first group of lenses G1, f2 is the focal length of the second group of lenses G2, f3 is the focal length of the third group of lenses G3, f4 is the focal length of the fourth group of lenses G4, β1 is the magnification of the first group of lenses, β4 is the magnification of the fourth group of lenses, q32 is the shape factor of the negative refractive power lens in the third group of lenses, f4b is the focal length of the negative refractive power lens in the fourth group of lenses, δ34 is the axial distance from the last optical surface of the third group of lenses to the first optical surface of the fourth group of lenses, h4a is the maximum height of a paraxial marginal ray on each optical surface of the second negative refractive power lens in the fourth group of lenses, h4max is the maximum height of a paraxial marginal ray in the fourth group of lenses, f4a is the focal length of the second negative refractive power lens of the fourth group of lenses, q4a is the shape factor of the second negative refractive power lens, g is the overall magnification of the optical system, and L is the distance between object and image of the optical system.

Figure 6A:
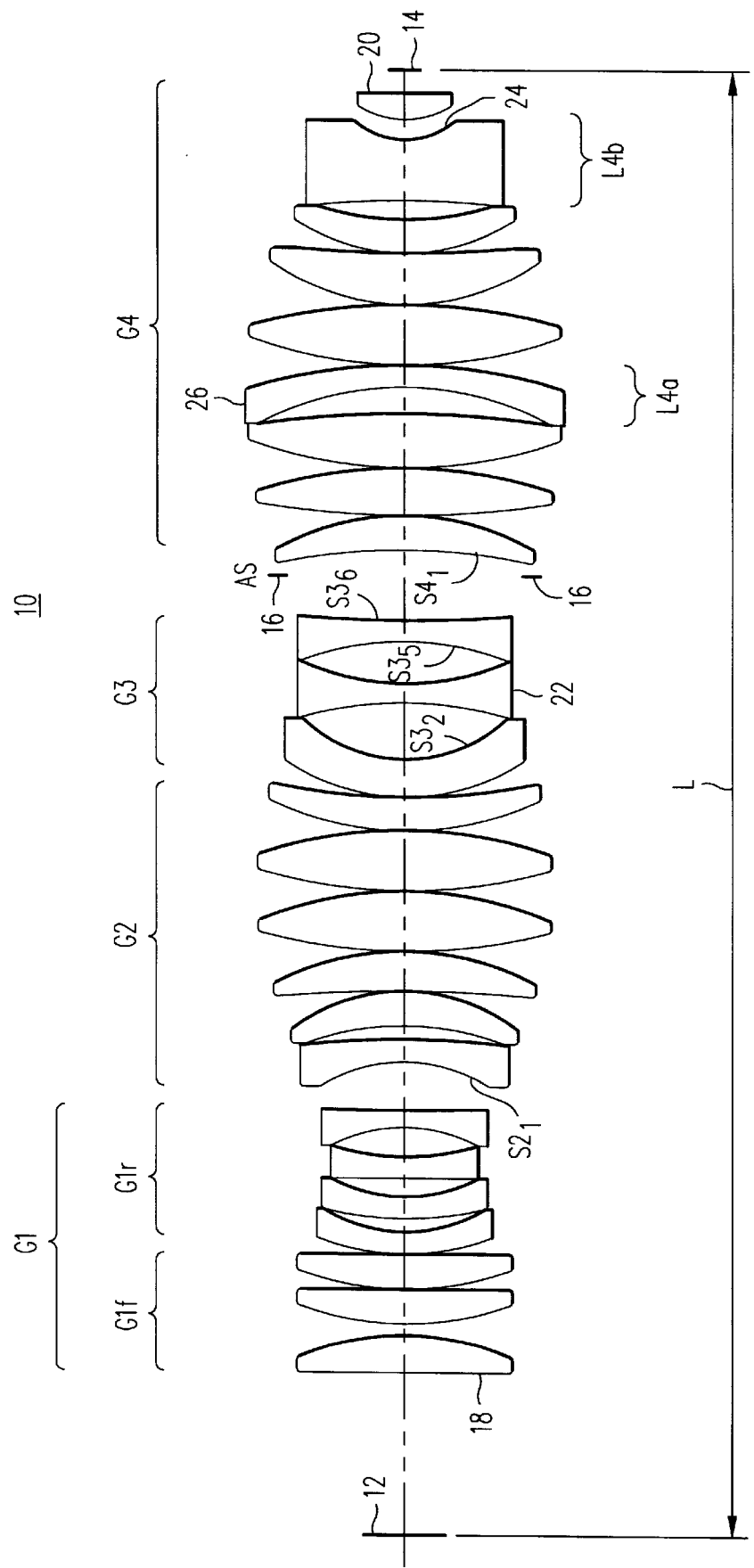
FIG. 6A shows a lens arrangement according to a sixth embodiment of the present invention.
Figure 6B:
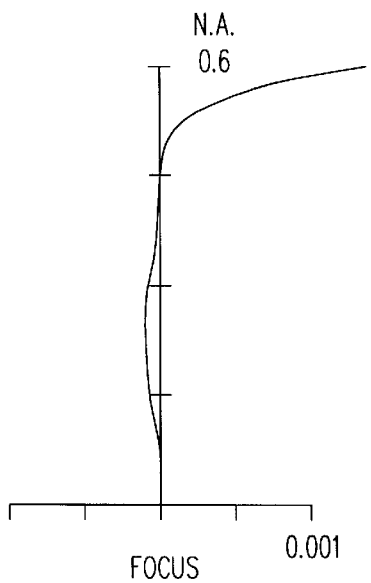
FIGS. 6B–6E show measured optical aberrations of the lens arrangement shown in FIG. 6A.
Figure 6C:
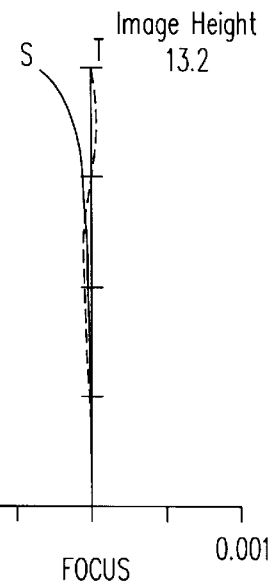
Figure 6D:
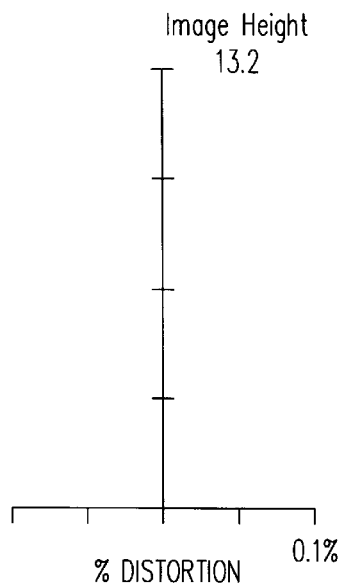
Figure 6E:
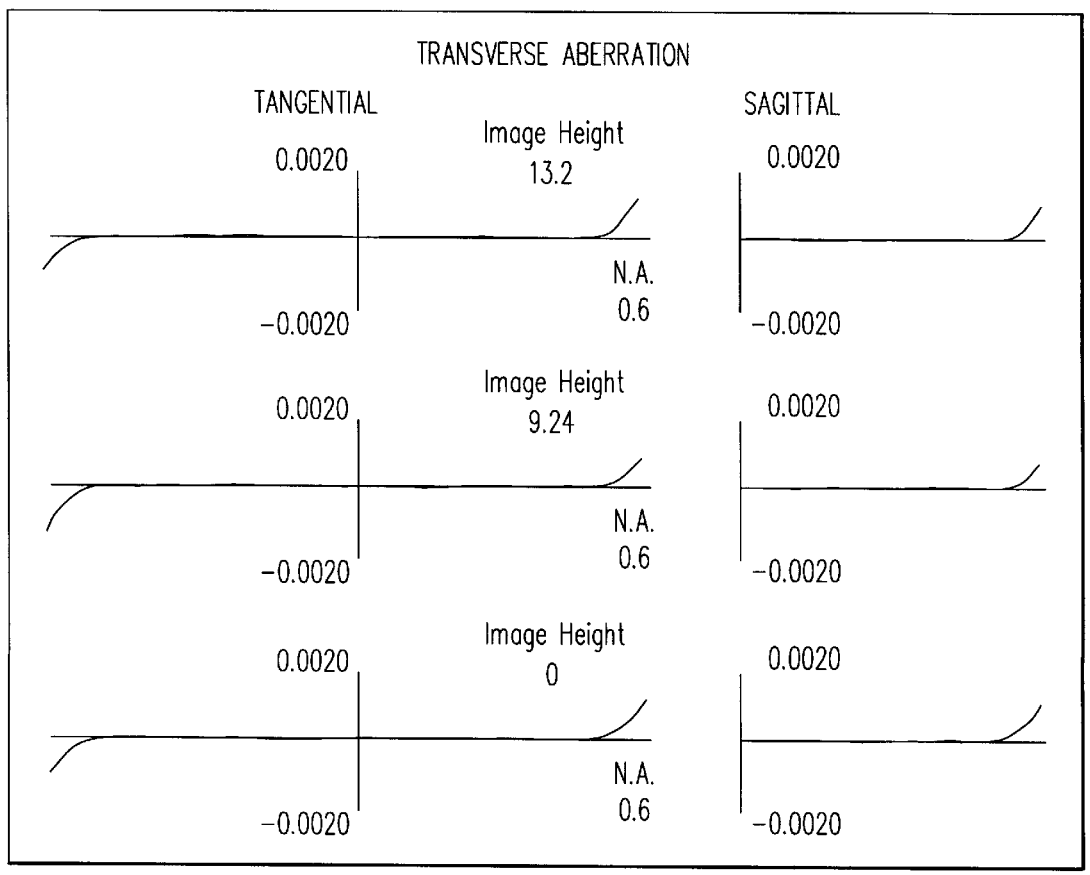

FIG. 6A shows a sixth embodiment of the present invention. In the sixth embodiment, the second group of lenses G2 includes five positive refractive power lenses. FIGS. 6B to 6E show measured optical aberrations of the lens arrangement as shown in FIG. 6A. Example 6 is a listing of numerical values for Embodiment 6 shown in FIG. 6A.

EXAMPLE 6

Object plane to first optical surface = 116.330 mm
Last optical surface to image plane = 15.465 mm
En = 3879.674 mm   Ex = −6705.945 mm   f1 = −1780.333 mm
f2 = 125.073 mm   f3 = −80.363 mm   f4 = 114.542 mm
β1 = 0.4672   β4 = −0.6267   q32 = −0.2504
f4b = −95.400 mm   δ34 = 54.136 mm   h4a = 81.238 mm
h4max = 87.926 mm   f4a = −1114.151 mm   q4a = 3.556
β = −0.25   L = 980.000

| Surface # | Radius of Curvature (mm) | axial distance (mm)* | lens material |
|---|---|---|---|
| 1 | −9940.0000 | 21.075 | SiO$_2$ |
| 2 | −248.4887 | 8.198 | |
| 3 | 336.5503 | 20.761 | SiO$_2$ |
| 4 | −1124.2938 | 0.788 | |
| 5 | 183.7585 | 21.971 | SiO$_2$ |
| 6 | 1033.1260 | 0.500 | |
| 7 | 134.2105 | 13.200 | SiO$_2$ |
| 8 | 87.4010 | 9.239 | |
| 9 | 137.9589 | 13.200 | SiO$_2$ |
| 10 | 89.7449 | 16.813 | |
| 11 | −4452.5483 | 13.200 | SiO$_2$ |
| 12 | 121.2519 | 19.897 | |
| 13 | −147.6844 | 13.200 | SiO$_2$ |
| 14 | 1164.5237 | 27.243 | |
| 15 | −128.3377 | 13.200 | SiO$_2$ |
| 16 | −1059.8158 | 11.076 | |
| 17 | −240.4526 | 20.904 | SiO$_2$ |
| 18 | −151.4361 | 0.736 | |
| 19 | −990.5425 | 24.776 | SiO$_2$ |
| 20 | −234.0813 | 0.500 | |
| 21 | 412.6743 | 39.639 | SiO$_2$ |
| 22 | −303.6065 | 0.500 | |
| 23 | 259.0267 | 37.787 | SiO$_2$ |
| 24 | −670.6207 | 0.500 | |
| 25 | 237.3712 | 22.511 | SiO$_2$ |
| 26 | 627.5033 | 0.500 | |
| 27 | 154.9542 | 30.365 | SiO$_2$ |
| 28 | 106.3850 | 31.852 | |
| 29 | −213.5493 | 13.200 | SiO$_2$ |
| 30 | 128.0273 | 27.700 | |
| 31 | −147.8348 | 15.548 | SiO$_2$ |
| 32 | 797.8470 | 33.038 | |
| AS | Infinity | 21.098 | |
| 33 | −810.3877 | 25.016 | SiO$_2$ |
| 34 | −203.8756 | 0.500 | |
| 35 | 446.1791 | 30.359 | SiO$_2$ |
| 36 | −489.3865 | 0.500 | |
| 37 | 256.9021 | 35.758 | SiO$_2$ |
| 38 | −987.1242 | 16.957 | |
| 39 | −242.8093 | 13.200 | SiO$_2$ |
| 40 | −432.7711 | 0.500 | |
| 41 | 297.6719 | 38.256 | SiO$_2$ |
| 42 | −445.5888 | 0.500 | |
| 43 | 130.6978 | 33.678 | SiO$_2$ |
| 44 | 467.2291 | 0.500 | |
| 45 | 125.4406 | 20.743 | SiO$_2$ |
| 46 | 181.5910 | 12.694 | |
| 47 | −1066.6382 | 37.762 | SiO$_2$ |
| 48 | 51.4183 | 9.830 | |
| 49 | 50.2058 | 26.738 | SiO$_2$ |
| 50 | 643.2380 | | |

*The axial distance is either axial lens thickness or axial distance between adjacent lenses.

En is the distance measured from the first optical surface on the object side of the optical system to the entrance pupil of the optical system, Ex is the distance measured from the last optical surface on the image side of the optical system to the exit pupil of the optical system, f1 is the focal length of the first group of lenses G1, f2 is the focal length of the second group of lenses G2, f3 is the focal length of the third group of lenses G3, f4 is the focal length of the fourth group of lenses G4, β1 is the magnification of the first group of lenses, β4 is the magnification of the fourth group of lenses, q32 is the shape factor of the negative refractive power lens in the third group of lenses, f4b is the focal length of the negative refractive power lens in the fourth group of lenses, δ34 is the axial distance from the last optical surface of the third group of lenses to the first optical surface of the fourth group of lenses, h4a is the maximum height of a paraxial marginal ray on each optical surface of the second negative refractive power lens in the fourth group of lenses, h4max is the maximum height of a paraxial marginal ray in the fourth group of lenses, f4a is the focal length of the second negative refractive power lens of the fourth group of lenses, q4a is the shape factor of the second negative refractive power lens, β is the overall magnification of the optical system, and L is the distance between object and image of the optical system.

Figure 7A:
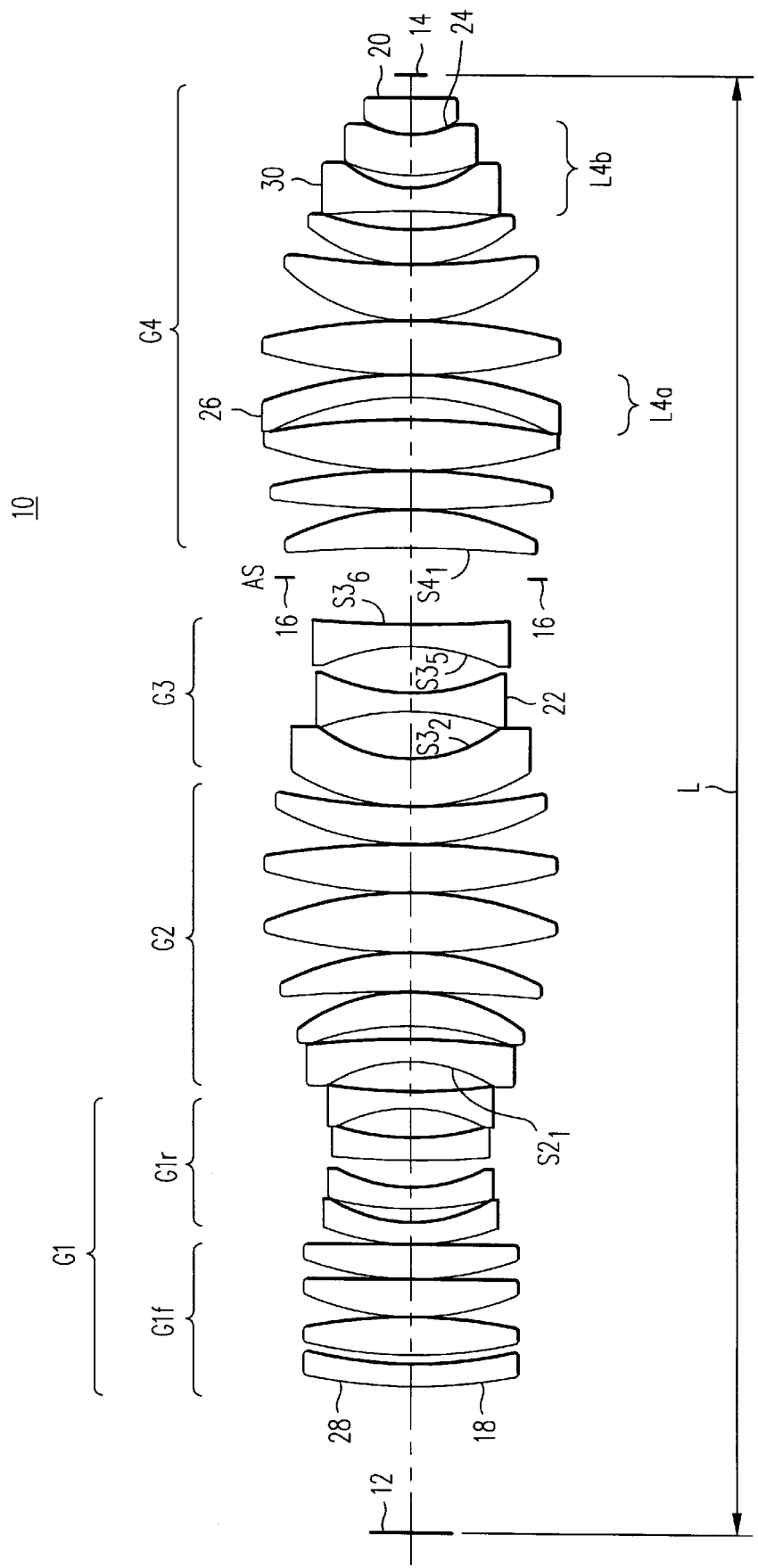
FIG. 7A shows a lens arrangement according to a seventh embodiment of the present invention.
Figure 7B:
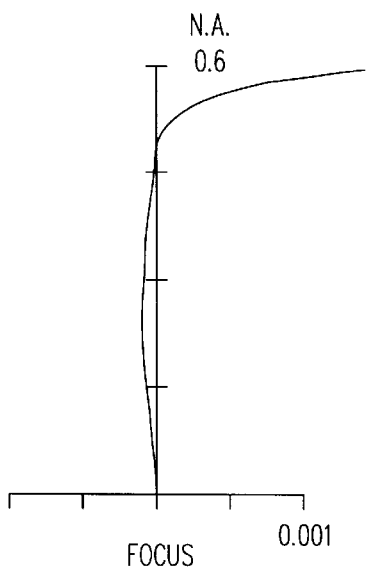
FIGS. 7B–7E show measured optical aberrations of the lens arrangement shown in FIG. 7A.
Figure 7C:
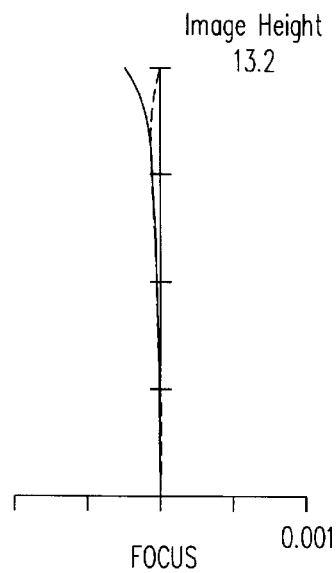
Figure 7D:
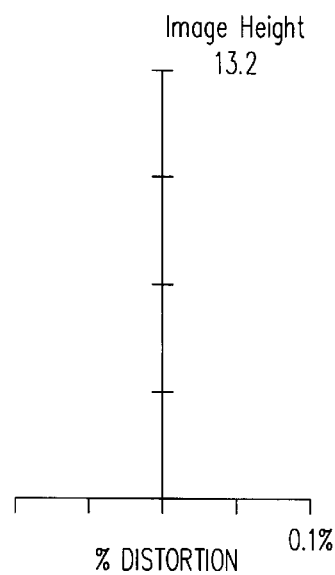
Figure 7E:
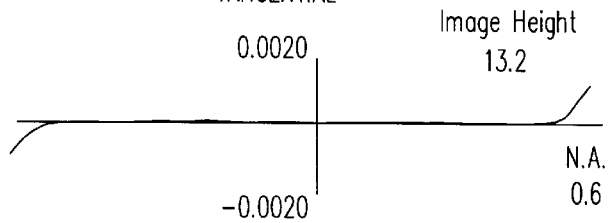
Figure 7E:
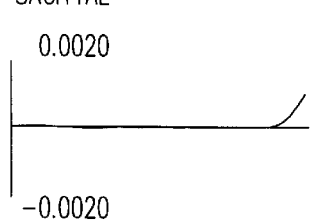

FIG. 7A shows a seventh embodiment of the present invention. In the seventh embodiment, the front group of lenses G1f in the first group of lenses includes a negative refractive power lens 28 and the fourth group of lenses G4 includes an additional negative refractive power lens 30. FIGS. 7B to 7E show measured optical aberrations of the lens arrangement as shown in FIG. 7A. Example 7 is a listing of numerical values for Embodiment 7 shown in FIG. 7A.

EXAMPLE 7

| | Object plane to first optical surface = 101.315 mm | | |
|---|---|---|---|
| | Last optical surface to image plane = 17.121 mm | | |
| En = 4696.014 mm | Ex = −8565.667 mm | f1 = −1348.993 mm | |
| f2 = 119.766 | f3 = −78.844 mm | f4 = 111.828 mm | |
| $\beta1$ = 0.4390 | $\beta4$ = −0.6267 | q32 = −0.2500 | |
| h4a = 82.681 mm | h4max = 86.591 mm | f4a = −1203.687 mm | |
| q4a = 4.267 | $\beta$ = −0.25 | L = 980.000 mm | |
| Surface # | Radius of Curvature (mm) | axial distance (mm)* | lens material |
| 1 | 406.8004 | 13.200 | $SiO_2$ |
| 2 | 261.7001 | 7.790 | |
| 3 | 419.3418 | 22.077 | $SiO_2$ |
| 4 | −487.5762 | 0.888 | |
| 5 | 302.6092 | 22.271 | $SiO_2$ |
| 6 | −970.5439 | 0.500 | |
| 7 | 188.3639 | 24.131 | $SiO_2$ |
| 8 | Infinity | 0.500 | |
| 9 | 156.4066 | 13.200 | $SiO_2$ |
| 10 | 91.4023 | 11.070 | |
| 11 | 176.1740 | 13.242 | $SiO_2$ |
| 12 | 98.5191 | 18.147 | |
| 13 | 486.4538 | 13.200 | $SiO_2$ |
| 14 | 128.3436 | 19.474 | |
| 15 | −148.9359 | 13.200 | $SiO_2$ |
| 16 | 282.0349 | 21.168 | |
| 17 | −113.3427 | 13.205 | $SiO_2$ |
| 18 | −591.5183 | 9.481 | |
| 19 | −241.0986 | 20.757 | $SiO_2$ |
| 20 | −149.1301 | 1.343 | |
| 21 | −767.1261 | 25.531 | $SiO_2$ |
| 22 | −208.1746 | 0.500 | |
| 23 | 496.1750 | 40.582 | $SiO_2$ |
| 24 | −251.6479 | 0.500 | |
| 25 | 250.5406 | 36.133 | $SiO_2$ |
| 26 | −915.0211 | 0.509 | |
| 27 | 215.2170 | 23.766 | $SiO_2$ |
| 28 | 566.5459 | 0.947 | |
| 29 | 163.9259 | 32.534 | $SiO_2$ |
| 30 | 104.2115 | 32.160 | |
| 31 | −237.2329 | 14.394 | $SiO_2$ |
| 32 | 142.3397 | 30.267 | |
| 33 | −135.2560 | 14.803 | $SiO_2$ |
| 34 | 772.2937 | 29.959 | |
| AS | Infinity | 21.994 | |
| 35 | −1226.2055 | 25.988 | $SiO_2$ |
| 36 | −204.8952 | 0.500 | |
| 37 | 734.4489 | 26.659 | $SiO_2$ |
| 38 | −430.4449 | 0.500 | |
| 39 | 314.3788 | 33.736 | $SiO_2$ |
| 40 | −613.8078 | 15.134 | |
| 41 | −224.8719 | 13.200 | $SiO_2$ |
| 42 | −362.5427 | 1.771 | |
| 43 | 321.3405 | 36.356 | $SiO_2$ |
| 44 | −462.8995 | 0.500 | |
| 45 | 121.8532 | 37.127 | $SiO_2$ |
| 46 | 444.1222 | 0.500 | |
| 47 | 107.2585 | 22.132 | $SiO_2$ |
| 48 | 149.3250 | 12.346 | |
| 49 | 1314.4992 | 13.555 | $SiO_2$ |
| 50 | 60.2330 | 10.045 | |
| 51 | 92.2038 | 25.386 | $SiO_2$ |
| 52 | 66.7739 | 1.132 | |
| 53 | 52.6255 | 21.574 | $SiO_2$ |
| 54 | 1108.8530 | | |

*The axial distance is either axial lens thickness or axial distance between adjacent lenses.

En is the distance measured from the first optical surface on the object side of the optical system to the entrance pupil of the optical system, Ex is the distance measured from the last optical surface on the image side of the optical system to the exit pupil of the optical system, f1 is the focal length of the first group of lenses G1, f2 is the focal length of the second group of lenses G2, f3 is the focal length of the third group of lenses G3, f4 is the focal length of the fourth group of lenses G4, $\beta1$ is the magnification of the first group of lenses, $\beta4$ is the magnification of the fourth group of lenses, q32 is the shape factor of the negative refractive power lens in the third group of lenses, f4b is the focal length of the negative refractive power lens in the fourth group of lenses, h4a is the maximum height of a paraxial marginal ray on each optical surface of the second negative refractive power lens in the fourth group of lenses, h4max is the maximum height of a paraxial marginal ray in the fourth group of lenses, f4a is the focal length of the second negative refractive power lens of the fourth group of lenses, q4a is the shape factor of the second negative refractive power lens, $\beta$ is the overall magnification of the optical system, and L is the distance between object and image of the optical system.

Figure 8:
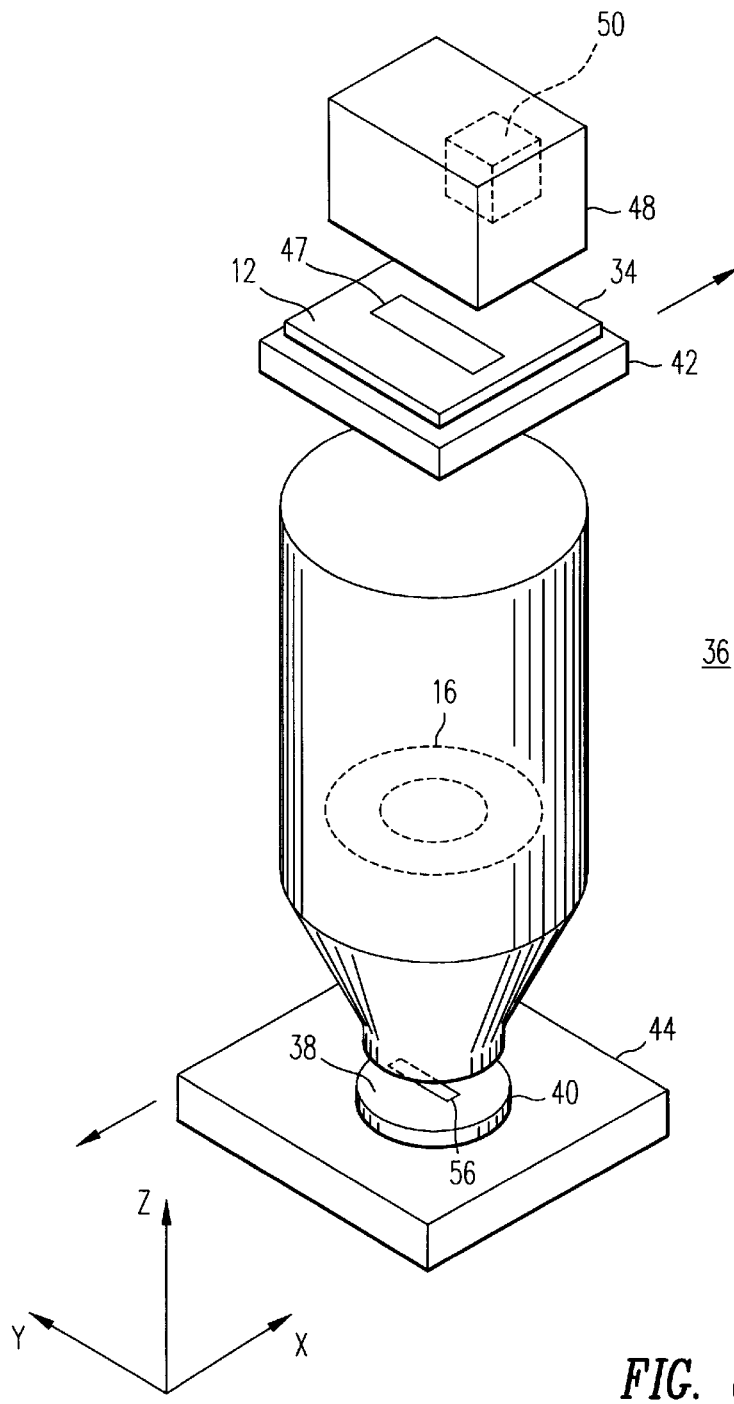
FIG. 8 shows a schematic setup of a scanning exposure apparatus in which the projection optical system according to the present invention can be applied.
Figure 9:
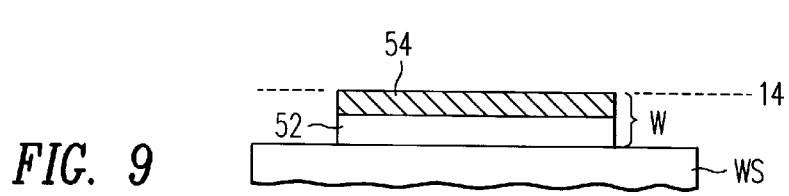
FIG. 9 shows the sectional structure of a photosensitive substrate.

FIG. 8 shows a schematic setup of a scanning exposure apparatus in which the projection optical system according to the present invention could be applied. In the exposure apparatus shown in FIG. 8, the reticle 34, which in this case is a photomask in which predetermined circuit patterns are formed, is disposed on the object plane 12 of the projection optical system 36 and the wafer 38 which is a photosensitive substrate is disposed on the image plane 14 of the projection optical system 36. The reticle 34 is held on a reticle stage 42 arranged to move in the X-direction upon exposure, and the wafer 38 is held on a wafer stage 44 arranged to move in the −X direction opposite to movement of the reticle stage 42. A rectangular slit 46 forms an illumination area 47 extending in the Y-direction on reticle 34, and an illumination optical system 48 is disposed above reticle 34. The illumination optical system 48 includes a light source 50. In this arrangement, the light supplied from the light source 50 in the illumination optical system 48 illuminates reticle 34 in a slit pattern. An image of the light source 50 in the illumination optical system 48 is formed at the position of the pupil (the position of aperture stop 16) of the projection optical system 36. This arrangement provides Kohler illumination. The image of the pattern of reticle 34 while being Kohler-illuminated is projected (or transferred) onto wafer 38 through projection optical system 36. The photosensitive substrate placed on wafer stage 44 is one obtained by coating the entire surface of exposed object 52 such as a silicon wafer, a glass plate, or the like with a photosensitive material 54 such as a photoresist, as shown in FIG. 9. The pattern image of reticle 34 formed on wafer 38 is a slit pattern image (rectangular shape extending in the Y-direction, as indicated at 56, FIG. 8. Thus, when the projection magnification factor of the projection optical system 36 is 1/M=$\beta$, the reticle stage 42 and wafer stage 44 are moved in mutually opposite directions along the X-direction in the velocity ratio of M:1, whereby the pattern image of the entire surface of reticle 34 is transferred onto the wafer 38.

The above embodiments show examples of the projection optical system to which an excimer laser for supplying light having the exposure wavelength $\lambda$ of 248 nm is applicable as a light source 50 disposed inside the illumination optical system 48. FIGS. 1A to 7E show lens layouts of the first to seventh embodiments of the projection optical system according to the present invention.

Each embodiment above showed an example using the KrF excimer laser with a wavelength of $\lambda$ equal to 248 nm as a light source. Further, light sources applicable to each embodiment include extreme ultraviolet light sources such as the ArF excimer laser supplying light at a wavelength of 193 nm, a mercury arc lamp supplying the light of the g-line (436 nm) and the i-line (365 nm), and light sources supplying light in the ultraviolet region other than the above.

In each embodiment, the lenses constituting the projection optical system are not cemented and all are made of a single optical material, silica ($SiO_2$). Because each embodiment as described above is constructed of a single optical material, cost reduction is achieved. However, if the exposure light has some half-width, it is preferred to construct the projection optical system with a combination of lenses of silica ($SiO_2$) and lenses of fluorite ($CaF_2$) or a combination of lenses made of various types of different materials in order to correct chromatic aberration. Particularly, if the exposure light source has a wide band, it is effective to correct for chromatic aberration by constructing the projection optical system by preparing plural types of lenses and combining those lenses.

Figure 10:
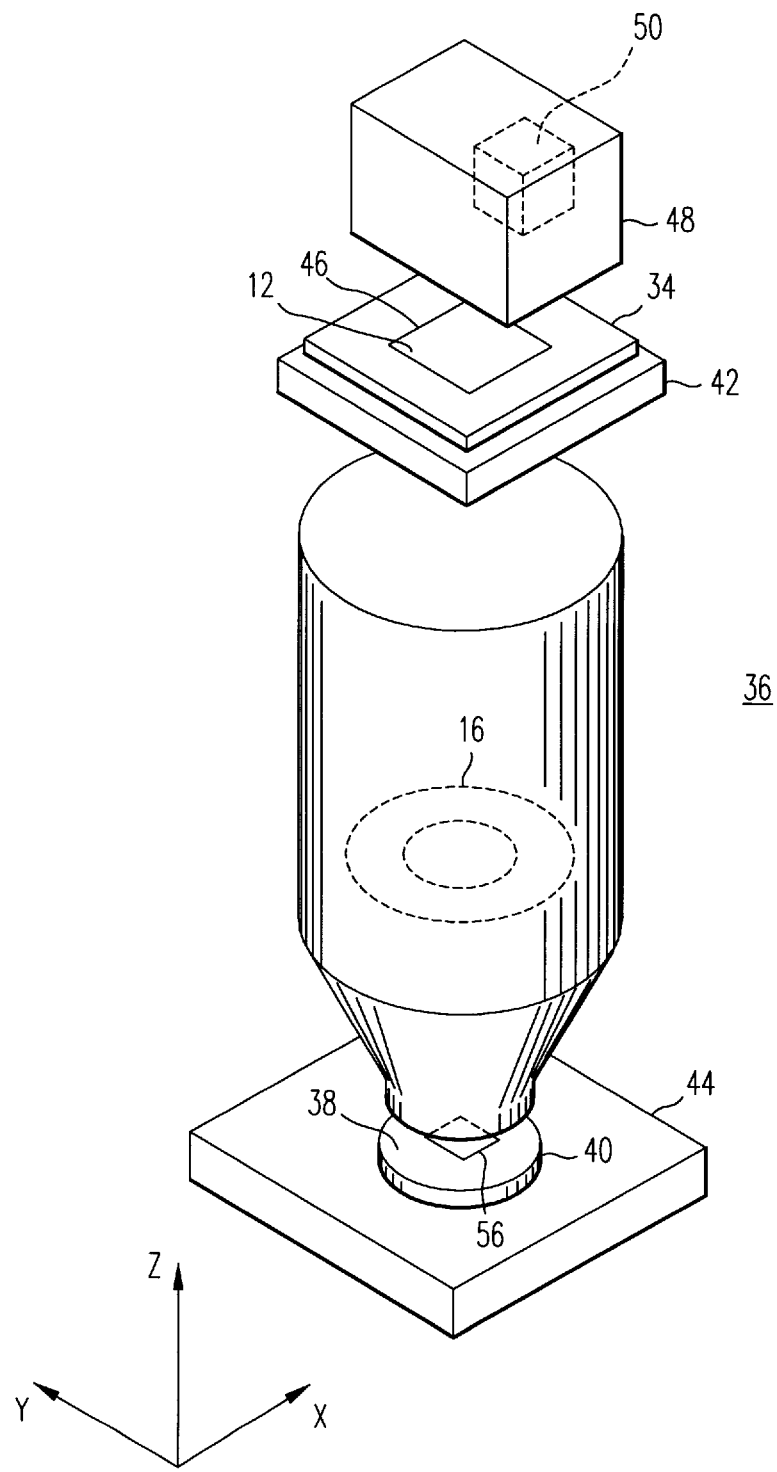
FIG. 10 shows the schematic setup of an exposure apparatus of the one-shot exposure method in which the projection optical system according to the present invention can be applied.

Further, the examples of the projection optical system of the first to seventh embodiments were described as applications to the scanning exposure apparatus, as shown in FIG. 8. However, the exposure apparatus to which the projection optical system of the present invention can be applied includes exposure apparatus of the one-shot exposure method for printing the patterns of reticle 34 on wafer 38 with one shot, for example, as shown in FIG. 10. It is noted that like numerals are used for like components in FIG. 10 as those shown in FIG. 8. The difference between FIG. 8 and FIG. 10 is that the shape of the image 46 in FIG. 10 is comprehends the entire surface of the reticle 34 and the shape of the image 47 in FIG. 8 is a rectangular slit which must be scanned over the surface of reticle 34.

As described above, the projection optical system according to the present invention is a bitelecentric optical system and realizes the high-resolution-power optical system as corrected for various aberrations in a good balance and having the large numerical aperture while securing a relatively wide exposure area.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

For example, in the above examples, a single glass material, fused silica ($SiO_2$), was used as an optical material for the projection optical system, but if narrowing of the bandwidth of the exposure light spectrum is not adequate, it is possible to compensate chromatic aberration by using fused silica ($SiO_2$) and fluorite ($CaF_2$). In addition, other variations can be made, for example, chromatic aberration can be compensated by using other optical materials with a superior transmittance factor in the ultraviolet range. This would allow the projection optical system, as described above, to be applicable to cases where other light sources are used. It is not intended that the present invention be restricted to a projection optical system using excimer lasers.

What I claim is:

1. An optical system comprising, in order from an object side to an image side:
    a first group of lenses;
    a second group of lenses with a positive refractive power;
    a third group of lenses with a negative refractive power;
    a fourth group of lenses with a positive refractive power;
    an aperture stop disposed between said third group of lenses and said fourth group of lenses;

wherein said optical system satisfies the following conditions:

$$|En|>L$$

$$|Ex|>|L/\beta|$$

wherein L is a distance between an object and an image of said optical system, En is a distance measured from a first optical surface on the object side of said optical system to an entrance pupil of said optical system, Ex is a distance measured from a last optical surface on an image side of said optical system to an exit pupil of said optical system, and $\beta$ is an overall magnification of said optical system.

2. The system of claim 1, wherein said optical system satisfies the following conditions:

$$-2.3<\beta1/\beta<-1.6$$

$$|f1|>L$$

wherein $\beta1$ is a magnification of said first group of lenses and f1 is a focal length of said first group of lenses.

3. The system of claim 2, wherein said optical system satisfies the following conditions:

$$2<\beta4/\beta<3$$

$$\delta34/L>0.05$$

wherein $\beta4$ is a magnification of said fourth group of lenses and $\delta34$ is an axial distance from a last optical surface of said third group of lenses to a first optical surface of said fourth group of lenses.

4. The system of claim 3, wherein said fourth group of lenses satisfies the following condition:

$$0.09<f4/L<0.16$$

wherein f4 is a focal length of said fourth group of lenses.

5. The system of claim 4, wherein said second group of lenses satisfies the following condition: $0.1<f2/L<0.2$ wherein f2 is a focal length of said second group of lenses.

6. The system of claim 5, wherein said third group of lenses satisfies the following condition:

$$-0.12<f3/L<-0.06$$

wherein f3 is a focal length of said third group of lenses.

7. The system of claim 6, wherein said third group of lenses comprises a pair of concave optical surfaces facing each other and at least one negative refractive power lens disposed between said pair of concave optical surfaces.

8. The system of claim 7, wherein said at least one negative refractive power lens disposed between said pair of concave optical surfaces satisfies the following condition:

$$q32<-0.2$$

wherein q32 is a shape factor defined by the following equation:

$$q32=(C1+C2)/(C1-C2)$$

wherein C1 is a curvature of an object side surface of said negative refractive power lens and C2 is a curvature of an image side surface of said negative refractive power lens.

9. The system of claim 8, wherein said first group of lenses comprises, in order from said object side:
    a front group of lenses with a positive refractive power; and a rear group of lenses with a negative refractive power.

10. The system of claim 9, wherein:
said front group of lenses of said first group of lenses includes at least two positive refractive power lenses; and
said rear group of lenses of said first group of lenses includes at least two negative refractive power lenses.

11. The system of claim 10, wherein said second group of lenses includes at least three positive refractive power lenses, and a first optical surface of said second group of lenses is a concave surface facing said object side.

12. The system of claim 11, wherein said fourth group of lenses includes at least six positive refractive power lenses and at least one negative refractive power lens with a concave optical surface facing said image side of said optical system.

13. The system of claim 12, wherein said at least one negative refractive power lens in said fourth group of lenses satisfies the following condition:

$$|f4b/L|<0.13$$

wherein f4b is a focal length of said at least one negative refractive power lens in said fourth group of lenses.

14. The system of claim 13, wherein said rear group of lenses of said first group of lenses includes at least three negative refractive power lenses.

15. The system of claim 14, wherein said second group of lenses includes at least four positive refractive power lens.

16. The system of claim 15, wherein said fourth group of lenses includes at least one second negative refractive power lens.

17. The system of claim 16, wherein said at least a second negative refractive lens of said fourth group of lenses is disposed on said object side of said at least one negative refractive power lens of said fourth group of lenses and wherein said at least one second negative refractive power lens satisfies the following condition:

$$h4a/(h4max>0.9)$$

wherein h4a is a maximum height of a paraxial marginal ray on each optical surface of said at least a second negative refractive power lens and h4max is a maximum height of said paraxial marginal ray in said fourth group of lenses.

18. The system of claim 17, wherein said at least one second negative refractive power lens of said fourth group of lenses satisfies the following conditions:

$$f4a/L<-1$$

$$3<q4a<5$$

wherein f4a is a focal length of said at least a second negative refractive power lens and q4a is a shape factor of said at least a second negative refractive power lens, wherein said shape factor q4a is defined by the following equation:

$$q4a =(C3+C4)/(C3-C4)$$

wherein C3 is a curvature of an object side surface of said at least a second negative refractive power lens and C4 is a curvature of an image side surface of said at least a second negative refractive power lens.

19. The system of claim 18, wherein said front group of lenses of said first group of lenses includes at least three positive refractive power lenses.

20. The system of claim 19, wherein said rear group of lenses of said first group of lenses includes at least four negative refractive power lenses.

21. The system of claim 20, wherein said second group of lenses includes at least five positive refractive power lenses.

22. The system of claim 21, wherein said front group of lenses in said first group of lenses includes at least one negative refractive power lens.

23. The system of claim 22, wherein said fourth group of lenses includes at least three negative refractive power lenses.

* * * * *